(12) United States Patent
Ma

(10) Patent No.: US 12,484,403 B2
(45) Date of Patent: Nov. 25, 2025

(54) DISPLAY PANEL AND DISPLAY APPARATUS

(71) Applicant: Wuhan Tianma Micro-Electronics Co., Ltd., Wuhan (CN)

(72) Inventor: Yufang Ma, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 430 days.

(21) Appl. No.: 18/109,447

(22) Filed: Feb. 14, 2023

(65) Prior Publication Data
US 2024/0164159 A1 May 16, 2024

(30) Foreign Application Priority Data

Nov. 10, 2022 (CN) .......................... 202211404096.9

(51) Int. Cl.
H10K 59/131 (2023.01)
H10K 77/10 (2023.01)
H10K 102/00 (2023.01)

(52) U.S. Cl.
CPC ......... H10K 59/131 (2023.02); H10K 77/111 (2023.02); *H10K 2102/311* (2023.02)

(58) Field of Classification Search
CPC ............... H10K 59/131; H10K 77/111; H10K 2102/311; Y02E 10/549; G09F 9/30; G02F 1/13452
See application file for complete search history.

(56) References Cited

U.S. PATENT DOCUMENTS

| 10,971,076 | B2* | 4/2021 | Kawachi | G09G 3/3275 |
| 11,910,678 | B1* | 2/2024 | Zhang | G09G 3/3233 |
| 2019/0067407 | A1* | 2/2019 | Yu | H10K 59/87 |
| 2021/0209979 | A1* | 7/2021 | Gao | G09G 3/2092 |
| 2022/0199750 | A1* | 6/2022 | Cho | G09G 3/3241 |
| 2024/0119898 | A1* | 4/2024 | Choi | H10K 59/88 |
| 2025/0061859 | A1* | 2/2025 | Choi | G09G 3/3233 |

FOREIGN PATENT DOCUMENTS

| CN | 113963622 A | 1/2022 |
| CN | 114783336 A | 7/2022 |
| WO | 2021035569 A1 | 3/2021 |

* cited by examiner

*Primary Examiner* — J. E. Schoenholtz
(74) *Attorney, Agent, or Firm* — Anova Law Group, PLLC

(57) ABSTRACT

A display panel and a display apparatus are provided in the present disclosure. The display panel includes a display region and a non-display region surrounding the display region. The non-display region includes a step region on a side of the display region; the step region includes a bending region, a first region between the bending region and the display region, and a second region on a side of the bending region away from the display region; and the second region includes a binding region. The display panel further includes an array substrate, including a flexible substrate and an array layer on the flexible substrate; a plurality of data lines in the array layer and the display region; a plurality of conductive soldering pads in the binding region; and a plurality of demultiplexing units in the second region and between the binding region and the bending region.

18 Claims, 17 Drawing Sheets

DISPLAY PANEL AND DISPLAY APPARATUS

CROSS-REFERENCE TO RELATED APPLICATION

The present application claims the priority of Chinese Patent Application No. 202211404096.9, filed on Nov. 10, 2022, the content of which is incorporated herein by reference in its entirety.

TECHNICAL FIELD

The present disclosure generally relates to the field of display technology and, more particularly, relates to a display panel and a display apparatus.

BACKGROUND

From cathode ray tube (CRT) displays to liquid crystal displays (LCD), organic light-emitting diode (OLED) displays, and light-emitting diode displays, the display industry has been developed for several decades. Electronic devices, which are from mobile phones, tablets, TVs, PCs to current smart wearable devices, virtual reality (VR), vehicle displays and other electronic devices, may be inseparable from display technology.

With the development of display technology, users have higher requirements for display products. For example, display products with narrow frames are current development trend. There is a need to effectively develop display products with narrow frames.

SUMMARY

One aspect of the present disclosure provides a display panel. The display panel includes a display region and a non-display region surrounding the display region, where the non-display region includes a step region on a side of the display region; the step region includes a bending region, a first region between the bending region and the display region, and a second region on a side of the bending region away from the display region; and the second region includes a binding region; an array substrate, including a flexible substrate and an array layer on the flexible substrate; a plurality of data lines in the array layer and the display region; a plurality of conductive soldering pads in the binding region; and a plurality of demultiplexing units in the second region and between the binding region and the bending region, where output terminals of the plurality of demultiplexing units are electrically connected to the plurality of data lines respectively, and input terminals of the plurality of demultiplexing units are electrically connected to the plurality of conductive soldering pads.

Another aspect of the present disclosure provides a display apparatus including a display panel. The display panel includes a display region and a non-display region surrounding the display region, where the non-display region includes a step region on a side of the display region; the step region includes a bending region, a first region between the bending region and the display region, and a second region on a side of the bending region away from the display region; and the second region includes a binding region; an array substrate, including a flexible substrate and an array layer on the flexible substrate; a plurality of data lines in the array layer and the display region; a plurality of conductive soldering pads in the binding region; and a plurality of demultiplexing units in the second region and between the binding region and the bending region, where output terminals of the plurality of demultiplexing units are electrically connected to the plurality of data lines respectively, and input terminals of the plurality of demultiplexing units are electrically connected to the plurality of conductive soldering pads.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
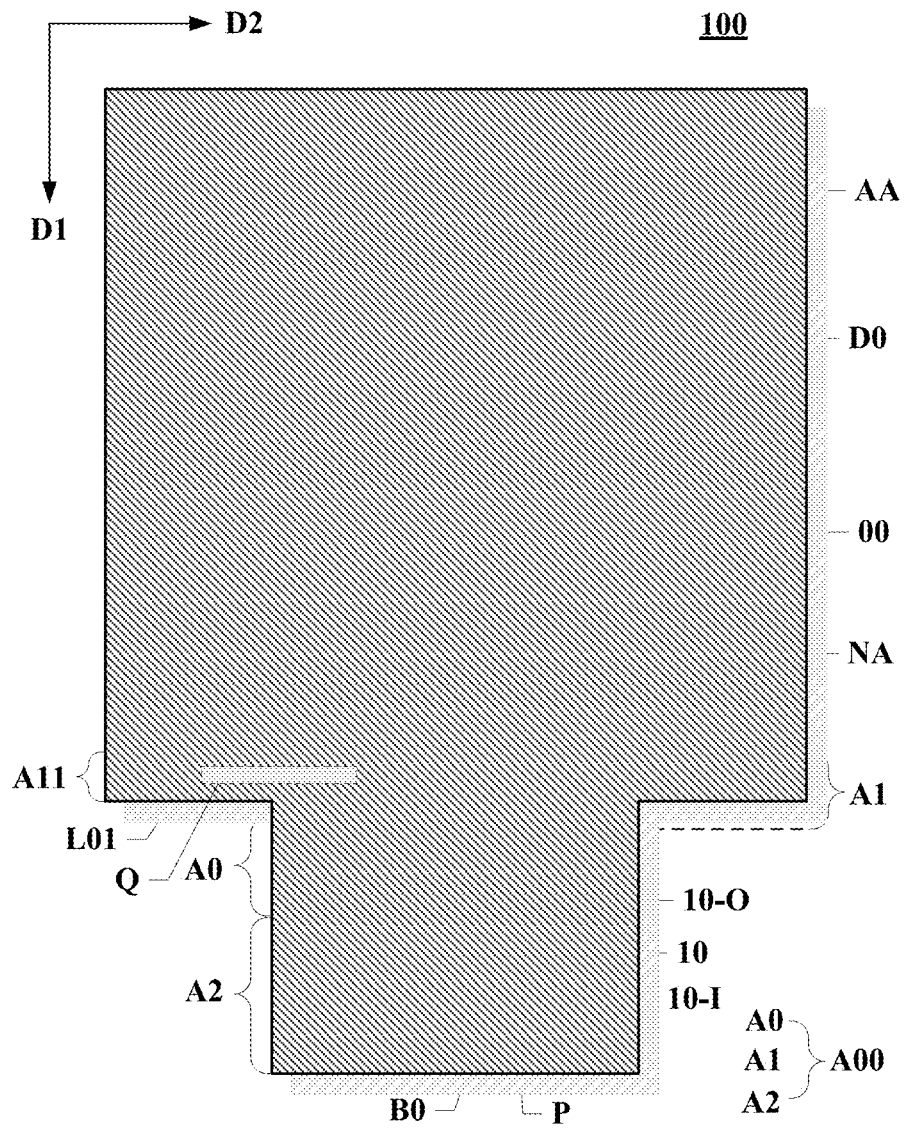
FIG. 1 illustrates a planar schematic of a display panel according to various embodiments of the present disclosure.

Various exemplary embodiments of the present disclosure are described in detail with reference to accompanying drawings. It should be noted that unless specifically stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be regarded as a part of the present disclosure.

In all examples shown and discussed herein, any specific value should be interpreted as merely exemplary, rather than as a limitation. Therefore, other examples in exemplary embodiment may have different values.

It is apparent to those skilled in the art that various modifications and variations may be made in the present disclosure without departing from the spirit or scope of the present disclosure. Therefore, the present disclosure is intended to cover modifications and variations of the present disclosure falling within the scope of corresponding claims (technical solutions to be protected) and their equivalents. It should be noted that, implementation manners provided in embodiment of the present disclosure may be combined with each other if there is no contradiction.

It should be noted that similar reference numerals and letters may be configured to indicate similar items in following drawings. Therefore, once an item is defined in one drawing, it does not need to be further discussed in subsequent drawings.

With the development of display technology, requirements for the display effect of the display panels become higher, the quantity of pixels in the display panel increases, the quantity of data signal lines increases, and data voltage output pins set in a binding region increase. As a result, a border region occupied by the binding region becomes larger. In order to reduce the border region occupied by the binding region, multiplexing circuits may be configured in the display panel in the existing technology. Through time-sharing driving manner, one data voltage output pin in the bonded region may respectively provide data voltage signals to multiple pixels in a same row.

However, the demultiplexing circuit is configured with multiple transistors as switch units, and one transistor corresponds to one data signal line. When the quantity of data signal lines in the display apparatus further increases, the quantity of transistors in the demultiplexing circuit may increase accordingly, such that the size of the demultiplexer circuit may increase, and occupied frame region may increase, which may not be beneficial for realizing narrow frame design requirement of the display apparatus.

In order to solve above technical problems, the present disclosure provides a display panel including a display region and a non-display region surrounding the display region. The non-display region may include a step region on a side of the display region. The step region may include a bending region, a first region between the bending region and the display region, and a second region at the bending region away from the display region, where the second region may include a binding region. The display panel may further include an array substrate including a flexible substrate and an array layer on the flexible substrate; a plurality of data lines in the array layer and the display region; a plurality of conductive soldering pads in the binding region; and a plurality of demultiplexing units in the second region and between the binding region and the bending region, where the output terminals of the demultiplexing units may be electrically connected to the data lines respectively, and the input terminals of the demultiplexing units may be electrically connected to the conductive soldering pads. In such way, the plurality of demultiplexing units may be folded back to a non-light-emitting surface of the display panel with the bending of the step region, which may avoid occupying the space of the first region, thereby being beneficial for realizing the narrow frame design of the product.

The core idea of the present disclosure is disclosed above, and the technical solutions in embodiments of the present disclosure may be clearly and completely described below in conjunction with accompanying drawings in embodiments of the present disclosure. Based on embodiments of the present disclosure, all other embodiments obtained by those skilled in the art without creative work should belong to the protection scope of embodiments of the present disclosure.

Figure 2:
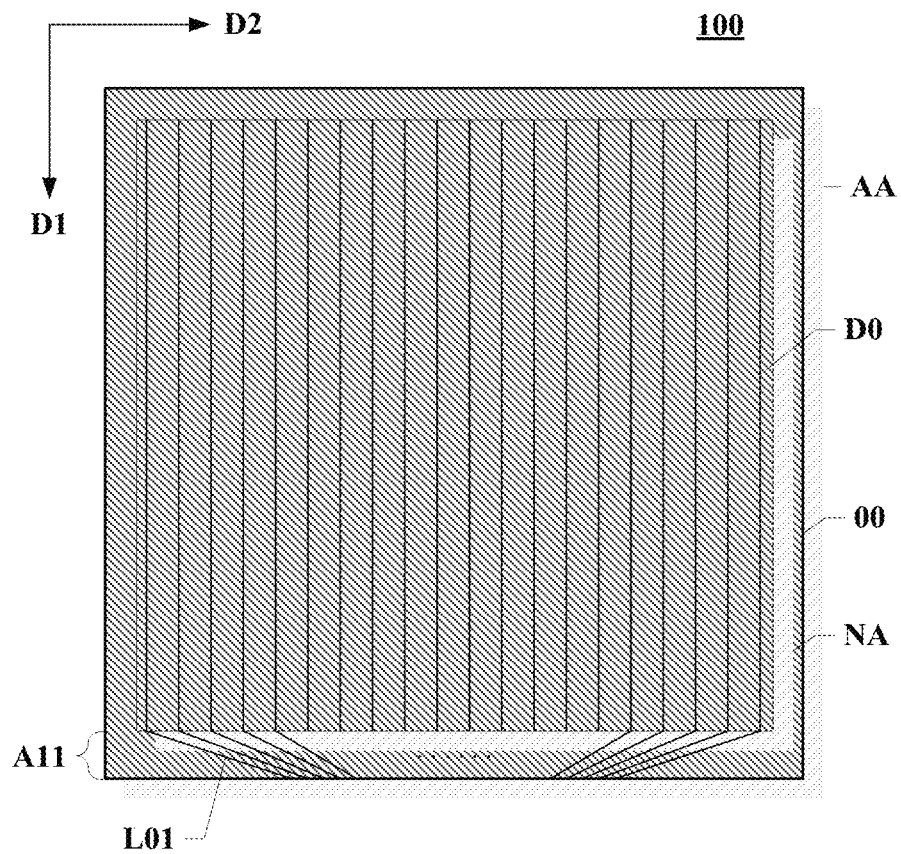
FIG. 2 illustrates a schematic of a display panel after being bent from a step region according to various embodiments of the present disclosure.
Figure 3:
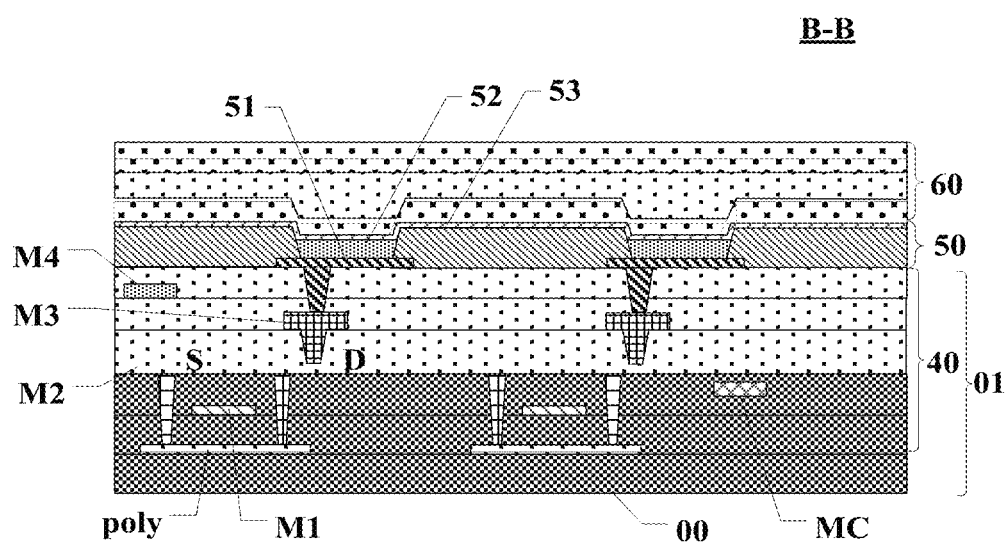
FIG. 3 illustrates a film layer schematic of a display panel along a BB direction in FIG. 1.

FIG. 1 illustrates a planar schematic of a display panel according to various embodiments of the present disclosure. The case that the display panel is not bent from the step region is described in one embodiment. FIG. 2 illustrates a planar schematic of the display panel after being bent from the step region according to various embodiments of the present disclosure. FIG. 3 illustrates a film layer schematic of the display panel along a BB direction in FIG. 1. Referring to FIGS. 1-3, the present disclosure provides a display panel including a display region AA and a non-display region NA surrounding the display region AA. The non-display region NA may include a step region A00 on a side of the display region AA. The step region A00 may include a bending region A0, a first region A1 between the bending region A0 and the display region AA, and a second region A2 on a side of the bending region A0 away from the display region AA; and the second region A2 may include a binding region B0.

The display panel may further include an array substrate 01 including a flexible substrate 00 and an array layer 40 on the flexible substrate 00; a plurality of data lines D0 in the array layer 40 and the display region AA; a plurality of conductive soldering pads P in the binding region B0; and a plurality of demultiplexing units 10 in the second region A2 and between the binding region B0 and the bending region A0, where the output terminals of the demultiplexing units 10 may be electrically connected to the data lines D0 respectively, and the input terminals of the demultiplexing units 10 may be electrically connected to the conductive soldering pads P.

It should be noted that FIG. 1 only exemplarily illustrates each region of the display panel and does not illustrate detailed structure of each region; and detailed structures of different regions are described in subsequent embodiments. The display panel with a rectangular outline structure is taken as an example for illustration in FIG. 2, which may not limit the outline structure of the display panel. In some other embodiments of the present disclosure, the outline structure of the display panel may also be embodied in another structure, for example, may also be embodied as a rectangle with rounded corners and the like. FIG. 3 only exemplarily illustrates a part of the film layer structure of the display panel, which may not limit actual quantity and sizes of film layers. Detailed film layer structure of the display panel is described in subsequent embodiments. In addition, FIGS. 1-2 only exemplarily illustrate the arrangement manner of the data lines DO included in the display region AA of the display panel and may not represent actual quantity of data lines DO included in the display panel.

It should also be noted that the "electrical connection" mentioned in embodiments of the present disclosure refers to an electrical connection which may be, for example, a direct contact connection between two connection bodies or an electrical connection between two connection bodies through other connection media (such as transistors), which may not be limited in the present disclosure.

For example, in the display panel provided by embodiments of the present disclosure, the non-display region NA may include the step region A00 configured on the side of the display region AA. The step region A00 may include the first region A1, the bending region A0, and the second region A2. The first region A1 may be adjacent to the display region AA, the bending region A0 may be between the first region A1 and the second region A2, the binding region B0 may be configured in the second region A2, and the binding region B0 may include the plurality of conductive soldering pads P. With the bending of the bending region A0, the second region A2 in the step region A00 may be folded back to the non-light-emitting surface of the display panel. In such way, the display panel may present a schematic planar structure as shown in FIG. 2. The display region AA may include the plurality of data lines DO; the data lines DO may be electrically connected to the conductive soldering pads P in the binding region B0 through the demultiplexing units 10; and the signals on the conductive soldering pads P may then be transmitted to the data lines DO through the demultiplexing units 10. Particularly, in the present disclosure, the demultiplexing units 10 may be configured in the second region A2 of the step region A00, for example, between the binding region B0 and the bending region A0. In such way, when the step region A00 is bent at the position of the bending region A0, the demultiplexing units 10 may be bent back to the non-light-emitting surface of the display panel with the bending of the step region A00, which may avoid occupying the space of the first region A1 and provide reducible space for the frame width corresponding to the first region A1, thereby being beneficial for realizing the narrow frame design of the display panel, increasing the screen-to-body ratio of the display product, and further improving user experience effect.

Referring to FIG. 1, in an optional implementation manner of the present disclosure, the step region A00 may further include a first fan-out region A11. The first fan-out region A11 may be in the first region A1 and include a plurality of fan-out wirings L01. The output terminals of the demultiplexing units 10 may be electrically connected to the data lines DO through the fan-out wirings L01.

For example, in the display panel provided by embodiments of the present disclosure, the first fan-out region A11 may be configured in the first region A1 adjacent to the display region AA. Optionally, one end of the fan-out wiring L01 in the first fan-out region A11 adjacent to the display region AA may be electrically connected to the data line DO in one-to-one correspondence; and another end of the fan-out wiring L01 away from the display region AA may be electrically connected to the output terminal of the demultiplexing unit 10. In such way, the signal transmitted in the demultiplexing unit 10 may be transmitted to corresponding data line DO through the fan-out wiring L01. A same demultiplexing unit 10 may include one input terminal 10-I and at least two output terminals 10-O. That is, a same demultiplexing unit 10 may be electrically connected to at least two data lines DO through the fan-out wirings. The input terminal 10-I of the demultiplexing unit 10 is electrically connected to the conductive soldering pad P of the binding region B0. Therefore, compared with the manner in the existing technology that one data line is electrically connected to one corresponding conductive soldering pad, the quantity of conductive soldering pads P in the binding region B0 may be greatly reduced after introducing the demultiplexing units 10 in embodiments of the present disclosure, thereby being beneficial for simplifying the structure of the control chip bound to the binding region B0.

Figure 4:
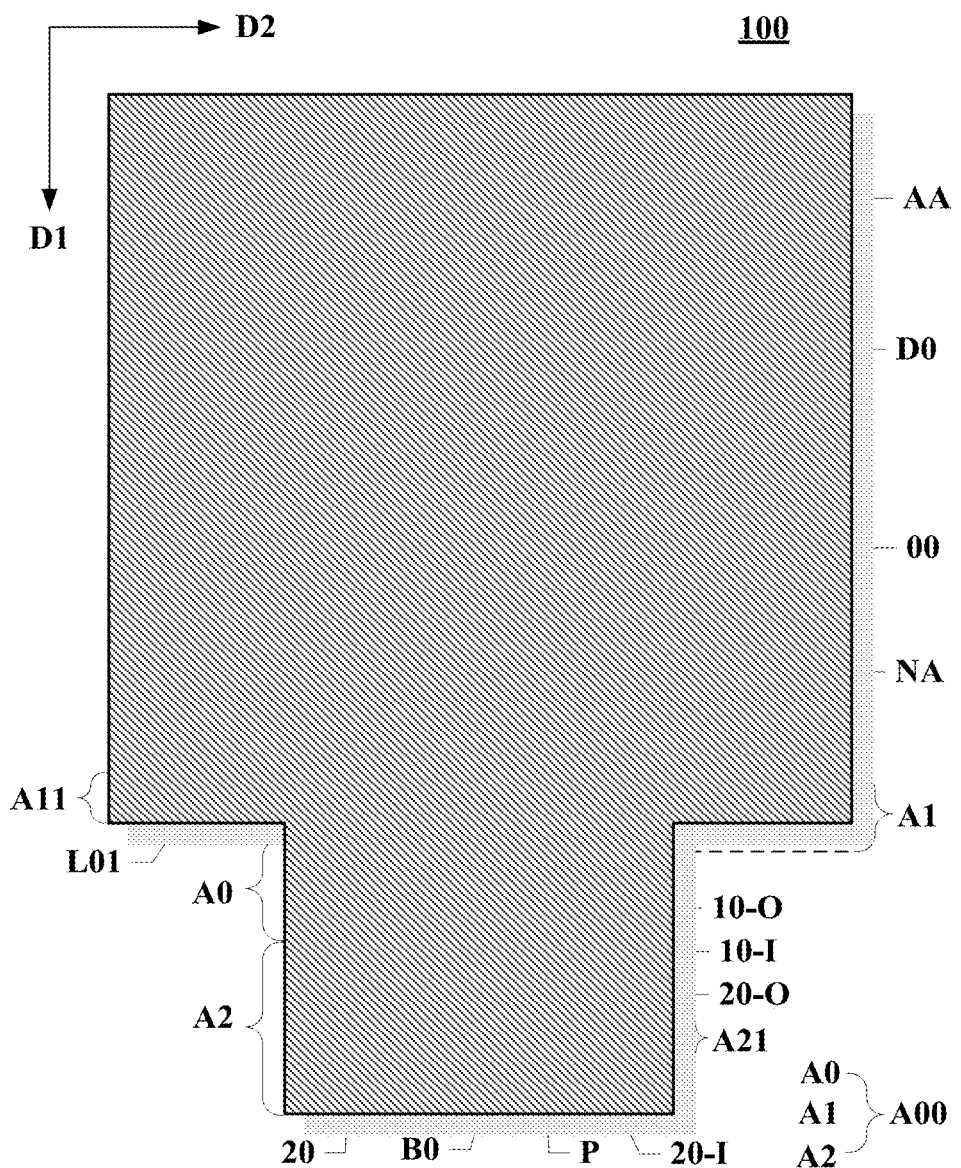
FIG. 4 illustrates another planar schematic of a display panel according to various embodiments of the present disclosure.
Figure 5:
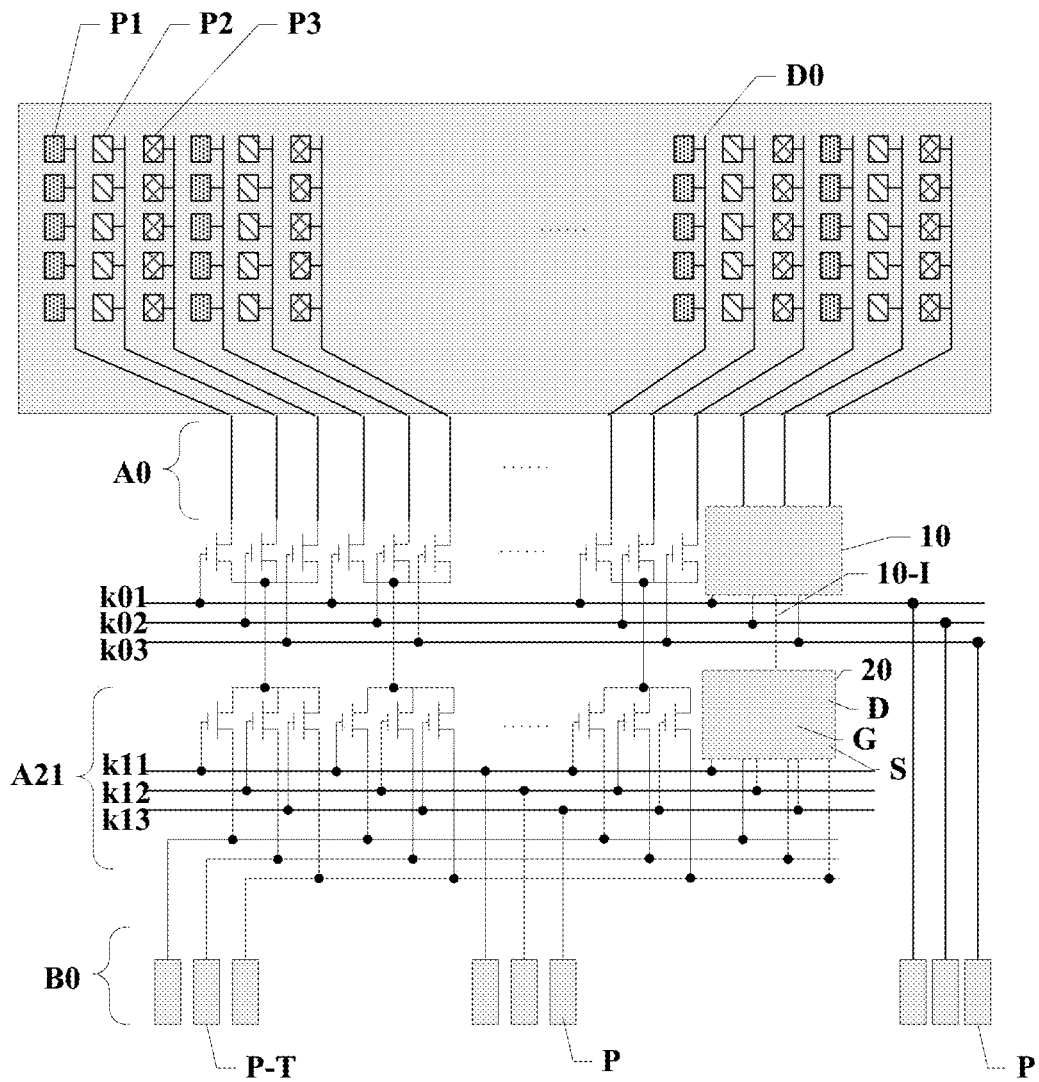
FIG. 5 illustrates a connection schematic of detection soldering pads, detection circuit units, demultiplexing units and data lines when the detection circuit units are used to detect a display panel.
Figure 6:
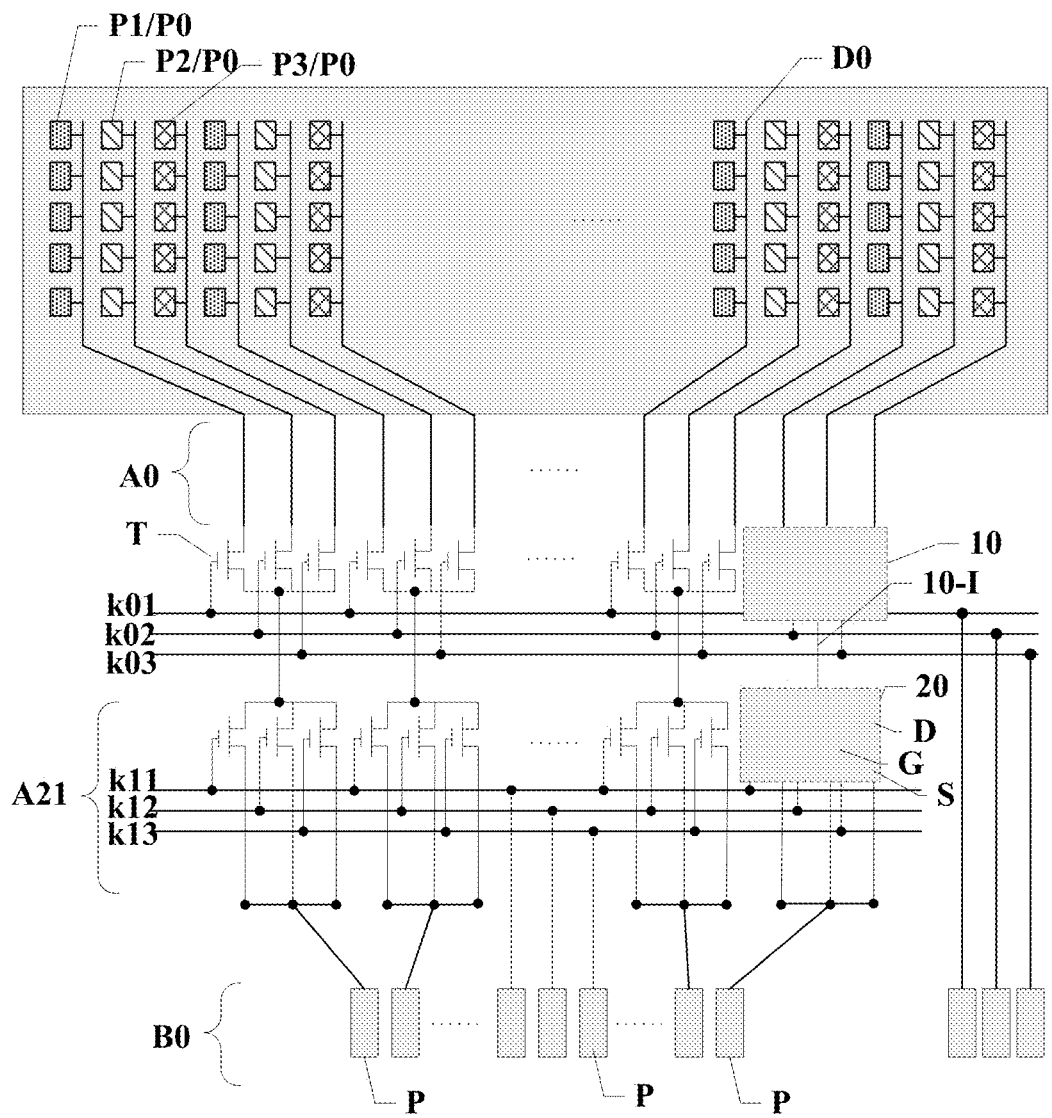
FIG. 6 illustrates a connection schematic of data lines, demultiplexing units, detection circuit units and conductive soldering pads according to various embodiments of the present disclosure.

FIG. 4 illustrates another planar schematic of a display panel according to various embodiments of the present disclosure. The solution thin the step region A00 further includes a detection circuit region A21 is described in one embodiment. FIG. 5 illustrates a connection schematic of detection soldering pads, detection circuit units 20, demultiplexing units 10 and data lines D0 when the detection circuit units 20 are used to detect the display panel. The connection relationship between the detection circuit units 20 and the demultiplexing units 10 is described in detail. FIG. 6 illustrates a connection schematic of data lines D0, demultiplexing units 10, detection circuit units 20 and conductive soldering pads P according to various embodiments of the present disclosure. Optionally, the detection circuit unit 20 may include a plurality of transistors.

Referring to FIGS. 4-6, in an optional implementation manner of the present disclosure, the step region A00 may further include the detection circuit region A21 between the bending region A0 and the binding region B0. The detection circuit region A21 may include the detection circuit unit 20 which is electrically connected to the data line D0 through the demultiplexing unit 10.

For example, when the detection circuit unit 20 is introduced into the display panel in embodiments of the present disclosure, the display panel may be detected during the fabrication process of the display panel. Optionally, the output terminal 20-O of the detection circuit unit 20 may be electrically connected to the input terminal of the demultiplexing unit 10; and when the driver chip has not been bound in the binding region B0, a detection signal may be applied to the input terminal 20-I of the detection circuit unit 20, and the detection signal may be provided to the data line D0 through the demultiplexing unit 10. Therefore, the detection of the display function of the display panel may be realized before binding the control chip, which may be beneficial for improving the product yield. In embodiments of the present disclosure, the detection circuit region A21 may be configured between the bending region A0 and the binding region B0. In such way, when the step region A00 is bent at the position of the bending region A0, the detection circuit unit 20 may be bent back to the non-light-emitting surface of the display panel with the bending of the step region A00, which may avoid occupying the space of the first region A1 and further provide reducible space for the border width corresponding to the first region A1, thereby being beneficial for realizing the narrow frame design of the display panel.

Referring to FIG. 5, in one embodiment, a same detection circuit unit 20 includes three transistors, and a same demultiplexing unit 10 also includes three transistors, which may be taken as an example for illustration. However, the quantity of transistors actually included in the detection circuit unit 20 and the demultiplexing unit 10 may not be limited according to embodiments of the present disclosure. In a same detection circuit unit 20, the first electrodes S of three transistors may be respectively connected to different detection signal terminals P-T; the second terminals D of three transistors may be electrically connected to each other and may be electrically connected to the input terminal 10-I of the demultiplexing unit 10; and the control terminals G of three transistors may be respectively connected to different control lines k11, k12 and k13. In the detection phase, detection signals may be respectively provided to the data lines D0 through three detection signal terminals P-T, thereby realizing the detection of the display panel. It should be noted that, in one embodiment, the positions of the detection signal terminals P-T in the display panel shown in FIG. 5 are only exemplary, which may not represent actual position. After the detection of the display panel is completed through the detection signal terminals P-T, the detection signal terminals P-T may be cut off, and final product may not include the detection signal terminals P-T. Therefore, the detection signal terminals P-T are not shown in FIG. 6 and other figures corresponding to other embodiments in which the detection signal terminals P-T are not used.

Referring to FIG. 6, after the detection is completed, the first terminals of the three transistors in a same detection circuit unit 20 may be electrically connected to the conductive soldering pads P in the binding region B0; and all transistors in the detection circuit unit 20 may be controlled to be in a conduction state through the control lines k11, k12 and k13. In such way, the conductive soldering pad P and the input terminal 10-I of the demultiplexing unit 10 may form a signal path; and the signal on the conductive soldering pad P may be transmitted to the demultiplexing unit 10 through the detection circuit unit 20.

Figure 7:
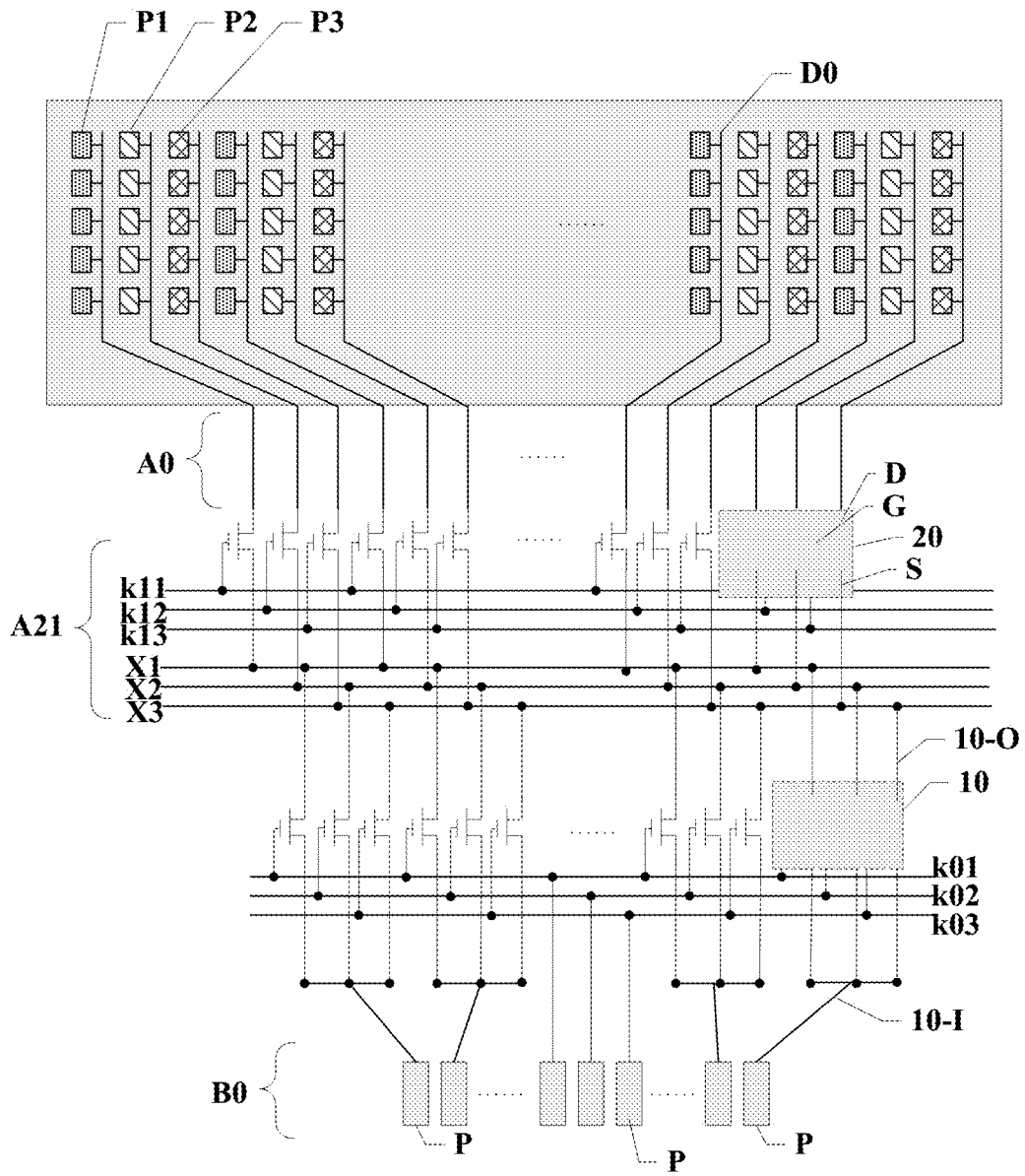
FIG. 7 illustrates another planar schematic of a display panel according to various embodiments of the present disclosure.

FIG. 7 illustrates another planar schematic of a display panel according to various embodiments of the present disclosure. The solution of disposing the demultiplexing unit 10 between the detection circuit region A21 and the binding region B0 is described in one embodiment. In an optional implementation manner of the present disclosure, referring to FIG. 7, the demultiplexing unit 10 may be between the detection circuit region A21 and the binding region B0; or referring to FIGS. 4-6, the demultiplexing unit 10 may be between the detection circuit region A21 and the bending region A0.

For example, when the demultiplexing unit 10 and the detection circuit region A21 are both configured to be between the bending region A0 and the binding region 0, the detection circuit region A21 may be configured to be between the demultiplexing unit 10 and the binding region B0, for example, as shown in FIGS. 4-6. Obviously, in some other embodiments of the present disclosure, the detection circuit region A21 and the demultiplexing unit 10 may also be configured in the positions shown in FIG. 7, that is, the demultiplexing unit 10 may be configured to be between the detection circuit region A21 and the bending region A0. In such two manners, with the bending of the bending region A0, the detection circuit region A21 and the demultiplexing unit 10 may be folded back to the non-light-emitting surface of the display panel, which may not occupy the frame space of the display panel, thereby being beneficial for realizing the narrow frame design of the display panel.

The connection relationship of FIGS. 4-6 has been described in above-mentioned embodiments, which may not be described in detail herein. For the solution in FIG. 7, optionally, the detection circuit unit 20 may include a plurality of transistors. In one embodiment, a same detection circuit unit 20 may include three transistors as an example for illustration. The first terminals S of three transistors may be respectively connected to different detection signal terminals P-T through signal transmission lines X1, X2 and X3; the second terminals D of three transistors may be electrically connected to different data lines D0 respectively; and the control terminals G of three transistors may be respectively connected to different control lines k11, k12 and k13. In the detection stage, the control lines k11, k12 and k13 may control three transistors in a same detection circuit unit 20 to be in time-share conduction and provide detection signals to the data lines D0 respectively through three detection signal terminals P-T, thereby realizing the detection of the display panel. After the detection is completed, the detection signal terminals P-T may no longer provide detection signals to the data lines D0. The input terminal 10-I of the demultiplexing unit 10 may be electrically connected to the conductive soldering pad of the binding region B0, and three output terminals 10-O of a same demultiplexing unit 10 may be electrically connected to above-mentioned signal transmission lines X1, X2 and X3 respectively. After binding the control chip on the display panel, each transistor in the detection circuit unit 20 may be in a conduction state, and the signal on the conductive soldering pad P may be transmitted to the data line D0 through the demultiplexing unit 10 and the detection circuit unit 20.

Figure 8:
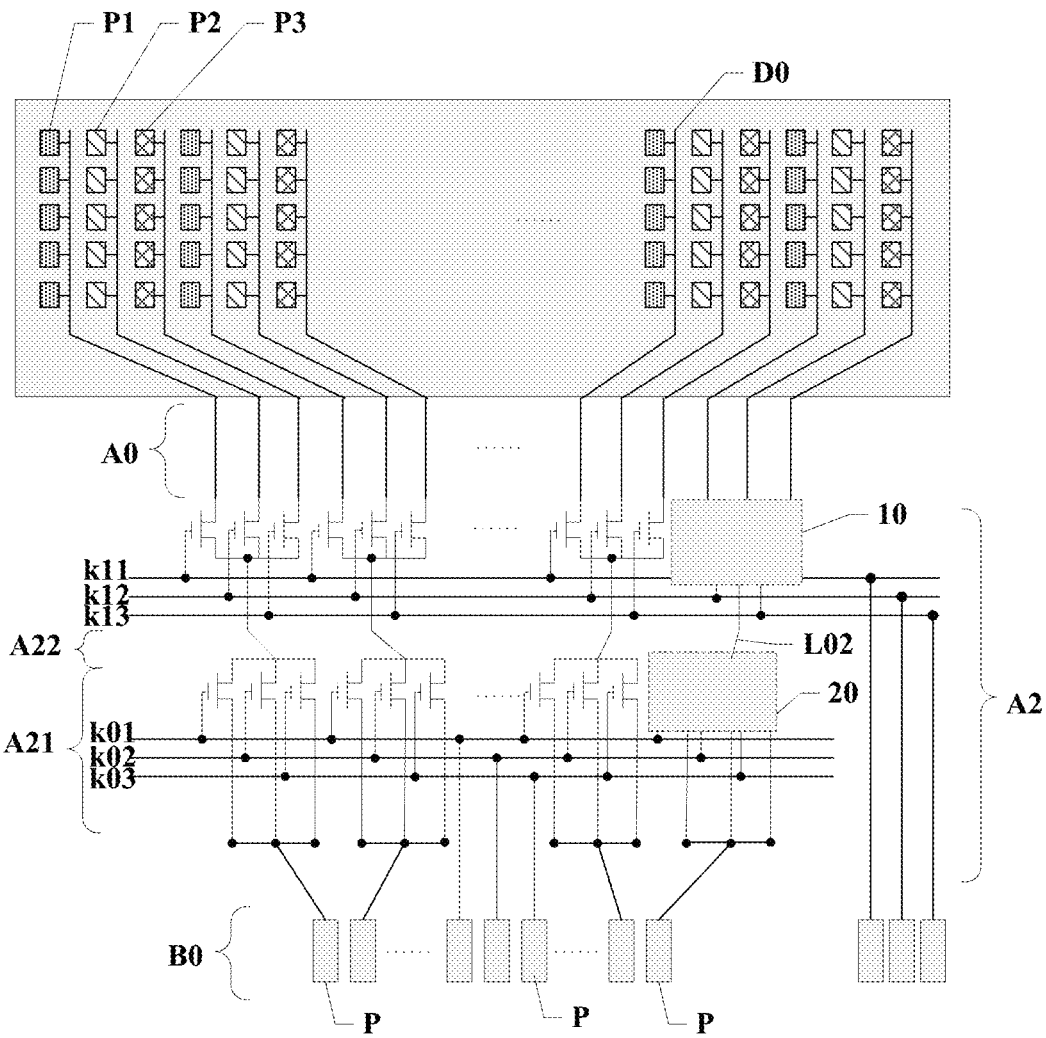
FIG. 8 illustrates another connection schematic of data lines, demultiplexing units, detection circuit units and conductive soldering pads according to various embodiments of the present disclosure.

FIG. 8 illustrates another connection schematic of data lines D0, demultiplexing units 10, detection circuit units 20 and conductive soldering pads P according to various embodiments of the present disclosure. Referring to FIG. 8, in an optional implementation manner of the present disclosure, the demultiplexing unit 10 may be between the detection circuit unit 20 and the bending region A0; the second region A2 may further include a second fan-out region A22; the second fan-out region A22 may be between the demultiplexing unit 10 and the detection circuit unit 20; and the detection circuit unit 20 may be electrically connected to the demultiplexing unit 10 through a fan-out wiring L02 of the second fan-out region A22.

For example, when both the demultiplexing unit 10 and the detection circuit unit 20 are configured in the second region A2, along the direction perpendicular to the extension direction of the data line D0, the width of entire region occupied by the demultiplexing unit 10 in the second region A2 may be different from the width of the detection circuit region A21. In one embodiment, when the second fan-out region A22 is introduced between the demultiplexing unit 10 and the detection circuit unit 20, the electrical connection between the demultiplexing unit 10 and the detection circuit unit 20 may be conveniently realized by utilizing the fan-out wiring in the second fan-out region A22.

Figure 9:
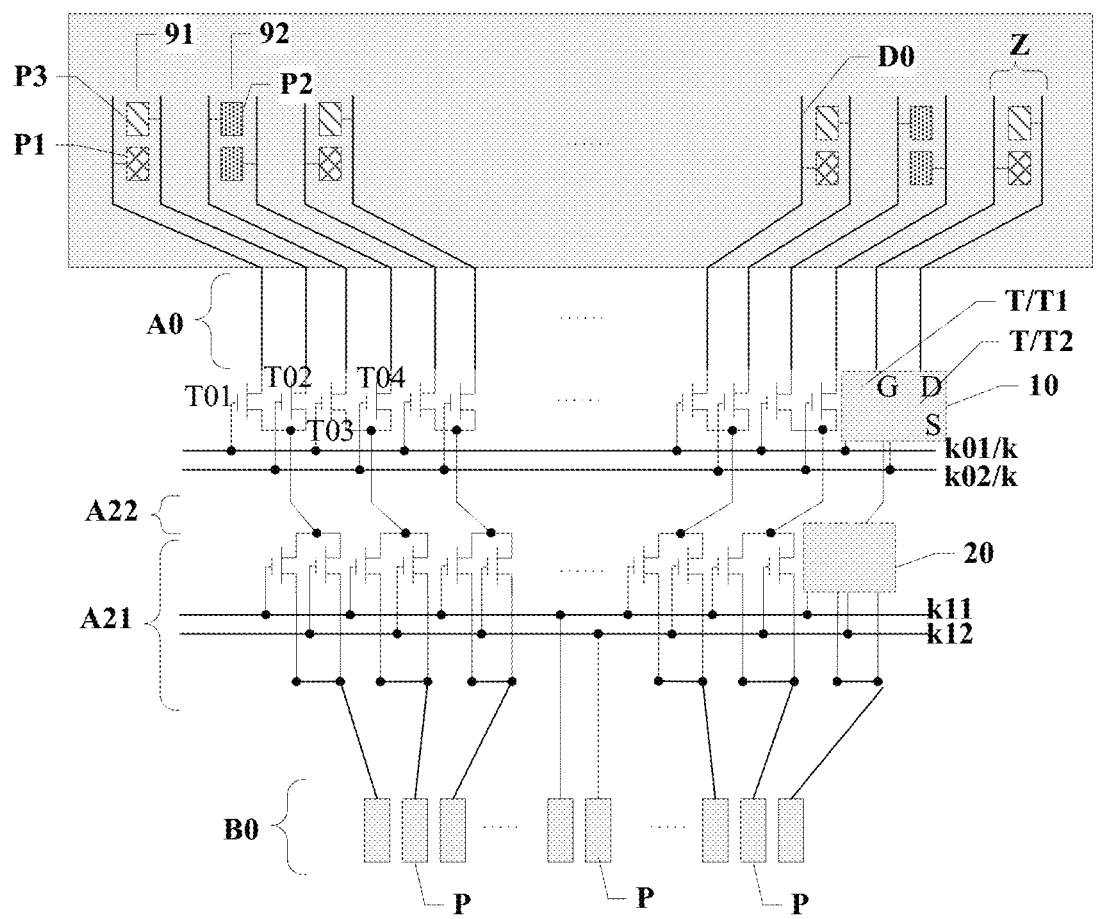
FIG. 9 illustrates a connection schematic of data lines, fan-out wirings and demultiplexing units in a display panel according to various embodiments of the present disclosure.

FIG. 9 illustrates a connection schematic of data lines D0, fan-out wirings and demultiplexing units in a display panel according to various embodiments of the present disclosure. In an optional implementation manner of the present disclosure, the display panel may include a plurality of data line groups Z; and the data line group Z may include X data lines D0, X≥2 and X is an integer. The demultiplexing unit 10 may include X switch elements T; the switch element T may include a control terminal G, an input terminal S and an output terminal D; the input terminals S of the X switch elements T of a same demultiplexing unit 10, which are connected to each other, may be electrically connected to a same conductive soldering pad P; and the output terminals D of the X switch elements T of a same demultiplexing unit 10 may be connected to the X data lines D0 of a same data line group Z in one-to-one correspondence. The display panel may further include X switch control lines k; and the control terminals G of the X switch elements T of the demultiplexing unit 10 may be connected to the X switch control lines k in one-to-one correspondence.

A same demultiplexing unit 10 may include a first switch element T1 and a second switch element T2. The switch control lines may include a first switch control line k11 and a second switch control line k12. The control terminal G of the first switch element T1 may be electrically connected to the first switch control line k11, and the control terminal G of the second switch element T2 may be electrically connected to the second switch control line k12.

For example, referring to FIG. 9, in embodiments of the present disclosure, the data lines D0 may be divided into the plurality of data line groups Z, each data line group Z may include X data lines D0. In one embodiment, X=2 is taken as an example for illustration. The switch control lines k may include a first switch control line k01 and a second switch control line k02. In addition, the plurality of demultiplexing units 10 may be introduced into the display panel. The quantity of demultiplexing units 10 may be same as the quantity of data line groups Z; and the quantity of switch elements T included in each demultiplexing unit 10 may be same as the quantity of data lines D0 included in each data line group Z. The X data lines D0 in a same data line group Z may be respectively connected to the output terminals D of the X switch elements T in a same demultiplexing unit 10; and the input terminals S of the X switch elements T in a same demultiplexing unit 10 may be connected together for connecting to a same conductive soldering pad P in the binding region B0. The control terminals G of the X switch elements T in a same demultiplexing unit 10 may be respectively connected to the X switch control lines k in one-to-one correspondence. By configuring that the X first switch elements T correspond to the X data lines D0 in one demultiplexing unit 10 in one-to-one correspondence, each first switch element T may independently control the signal transmission of corresponding data line D0. In addition, by connecting the input terminals S of the first switch elements T of the same demultiplexing unit 10 together to be electrically connected to a same conductive soldering pad P, the quantity of conductive soldering pads P in the binding region B0 may be reduced, and the structure of the control chip bound to the binding region B0 may be simplified. It should be noted that the quantity X of switch elements T included in each demultiplexing unit 10 may be configured according to the quantity of data lines D0 included in one data line group Z. In one embodiment, X=2 is only taken as an example for illustration. In some other embodiments of the present disclosure, X may also be other values greater than 2. For example, referring to FIG. 5, in one embodiment, X=3 is taken as an example for illustration. The switch control lines k0 may include the first switch control line k01, the second switch control line k02, and the third switch control line k03.

Figure 10:
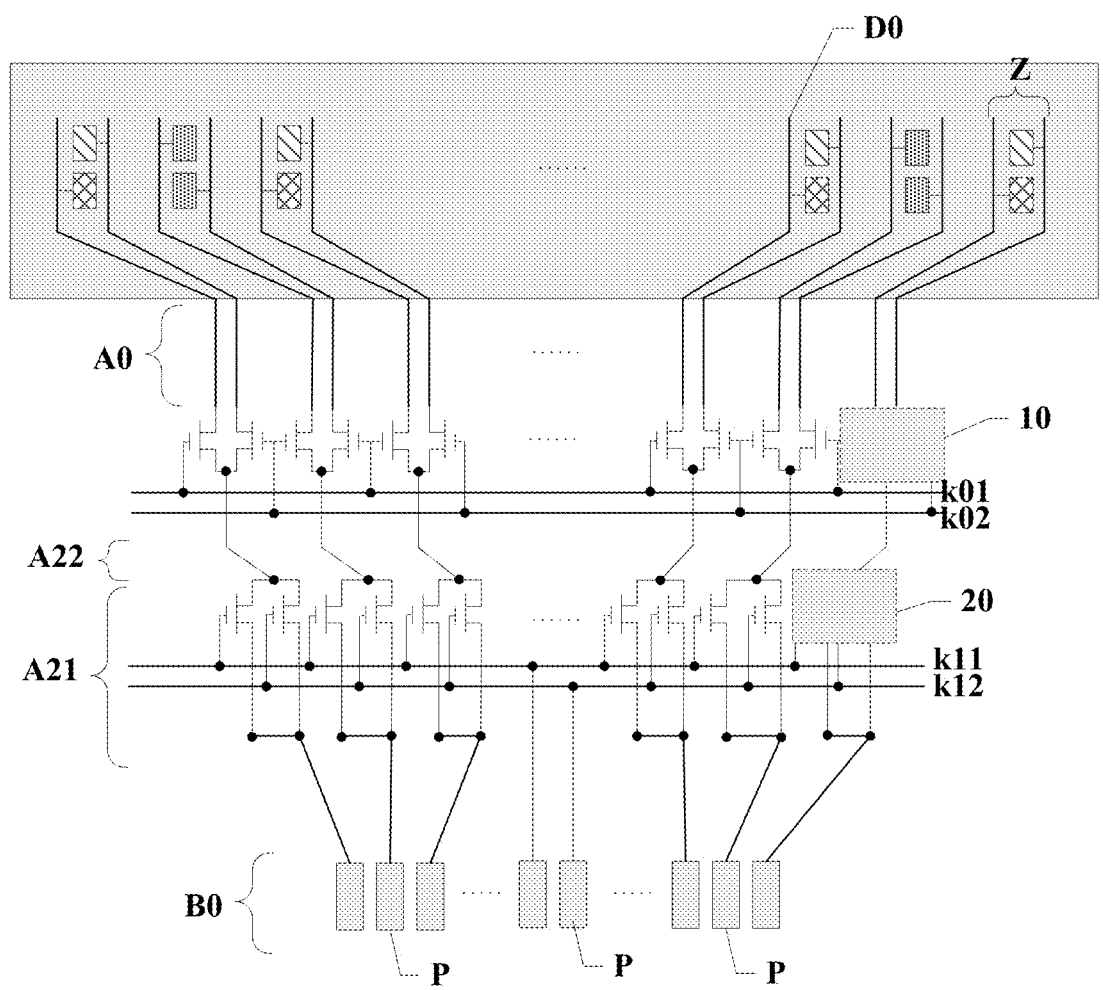
FIG. 10 illustrates another connection schematic of data lines, fan-out wirings and demultiplexing units in a display panel according to various embodiments of the present disclosure.
Figure 11:
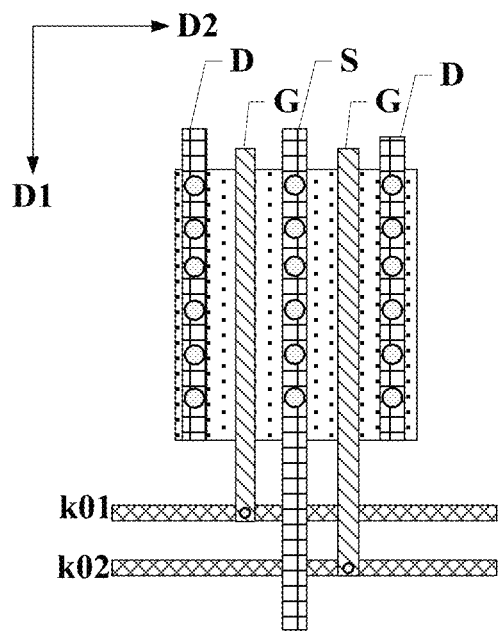
FIG. 11 illustrates a connection schematic of two adjacent demultiplexing units.
Figure 12:
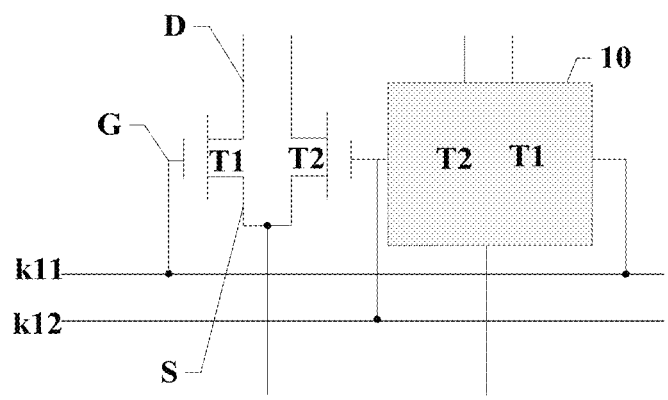
FIG. 12 illustrates a layout schematic corresponding to a single demultiplexing unit in FIG. 11.

FIG. 10 illustrates another connection schematic of data lines D0, fan-out wirings and demultiplexing units 10 in a display panel according to various embodiments of the present disclosure, which is different from the connection manner of the control terminals of the switch elements in the demultiplexing units in one embodiment in FIG. 9. FIG. 11 illustrates a connection schematic of two adjacent demultiplexing units 10. FIG. 12 illustrates a layout schematic corresponding to a single demultiplexing unit 10 in FIG. 11. Referring to FIGS. 10-12, in an optional embodiment of the present disclosure, in two adjacent demultiplexing units 10, two first switch elements T1 may be adjacent to each other, and the control terminals G of two first switch elements T1 may be connected to the first switch control line k11 through a same wiring; or two second switch elements T2 may be adjacent to each other, and the control terminals G of two second switch elements T2 may be connected to a same second switch control line k12 through a same wiring. In one embodiment, FIG. 12 illustrates a solution that the control terminals G of two adjacent second switch elements T2 may be connected to the second switch control line k12.

Figure 13:
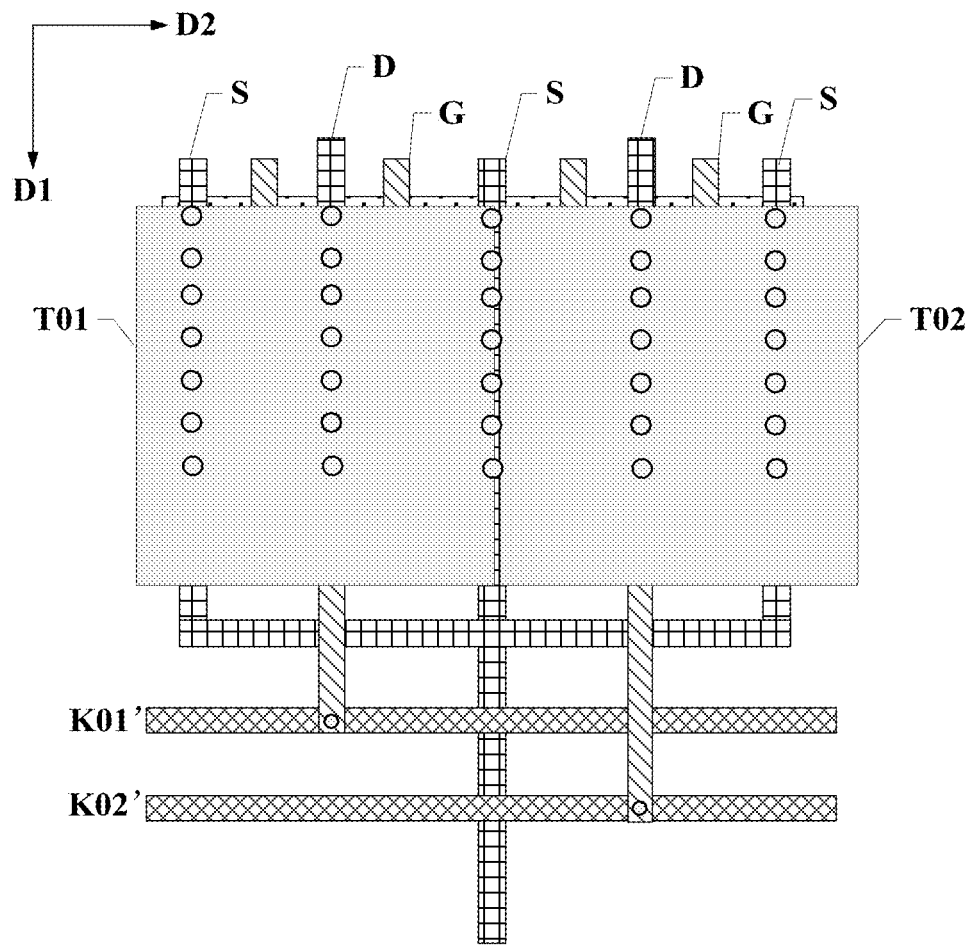
FIG. 13 illustrates a layout schematic of a single demultiplexing unit when demultiplexing units are configured in a lower frame region.
Figure 14:
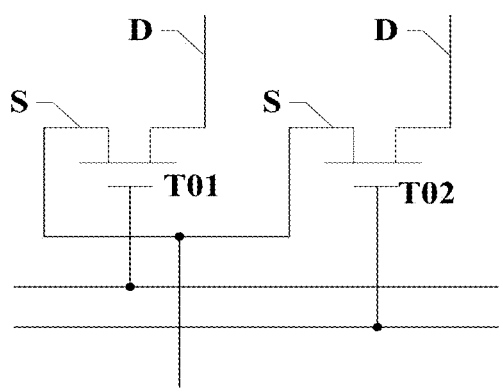
FIG. 14 illustrates a connection schematic corresponding to a demultiplexing unit shown in FIG. 13.

When the demultiplexing unit is configured in lower frame region of the display panel, the horizontal size of the lower frame region may be relatively large. When the demultiplexing unit 10 is configured between the bending region A0 and the binding region B0, the horizontal size of such partial region may be narrower than the size of the lower frame region of the display panel. It is assumed that when the demultiplexing unit is configured in the lower frame region of the display panel, the layout schematic and connection schematic of one single demultiplexing unit in the lower frame region refer to FIGS. 13-14. FIG. 13 illustrates a layout schematic of a single demultiplexing unit when demultiplexing units are configured in a lower frame region. FIG. 14 illustrates a connection schematic corresponding to a demultiplexing unit shown in FIG. 13. In one embodiment, the demultiplexing unit may only include two switch elements T01 and T02, and the control terminals G of two switch elements T01 and T02 may be respectively connected to different control lines k01' and k02', which is taken as an example for description. The horizontal distance (the distance along the second direction D2) of the lower frame of the display panel is relatively large. Therefore, in the existing technology, when the demultiplexing units are configured in the lower frame region, for example, referring to FIG. 13, two switch elements T01 and T02 in a same demultiplexing unit may be configured in a horizontal manner along the second direction D2. At this point, the layout schematic of two switch units T01 and T02 may include three branches of the source electrode S, two branches of the drain electrode D, and four branches of the gate G; and these branches may be arranged along the second direction D2. In embodiments of the present disclosure, when the demultiplexing units 10 are configured in the step region, the width of the step region along the second direction may be less than the width of the lower frame region, so that the layout of the switch elements is improved in embodiments of the present disclosure. Referring to FIG. 11, the layout schematic of two switch elements T1 and T2 may only include one branch of the source electrode S, two branches of the drain electrode D and two branches of the gate G; and these branches may be arranged along the second direction D2. Compared with the structure of FIG.

13, in embodiments of the present disclosure, the quantity of branches of the gates G and the source electrodes S of two switch elements in a same demultiplexing unit may be reduced. Therefore, the width of two switch elements in a same demultiplexing unit along the second direction D2 may be reduced, and the space occupied by the demultiplexing units along the second direction D2 may be reduced, thereby satisfying the layout size requirements of the step region.

In addition, referring to FIG. 14, in embodiments of the present disclosure, in two adjacent demultiplexing units 10, the control terminals G of two adjacent second switch elements T2 may be connected to the second switch control line k12 through a same wiring. In such way, the quantity of wirings connecting the switch elements and the switch control lines may be reduced, thereby reducing the space occupied by the wirings connecting the switch elements and the switch control lines in the step region and further satisfying normal layout requirement of the plurality of demultiplexing units in the step region.

Referring to FIG. 6, in an optional implementation manner of the present disclosure, the display region AA may include a plurality of sub-pixels P0; and the sub-pixels P0 may be electrically connected to the switch elements T through the data lines D0; the sub-pixels P may include a first-color sub-pixel P1 and a second-color sub-pixel P2; the turn-on voltage of the first-color sub-pixel P1 may be greater than the turn-on voltage of the second-color sub-pixel P2; and the width-to-length ratio of the switch element T connected to the first-color sub-pixel P1 is the first width-to-length ratio, the width-to-length ratio of the switch element T connected to the second-color sub-pixel P2 is the second width-to-length ratio, and the first width-to-length ratio may be greater than the second width-to-length ratio.

Referring to FIG. 6, in the display panel provided in one embodiment, the sub-pixel P may be electrically connected to the data line D0, and the data line D0 may be electrically connected to the switch element T in the demultiplexing unit 10. When corresponding switch element T is in conduction, the signal in the binding region B0 may be transmitted to corresponding sub-pixel P through the switch element T and the data line D0. When the sub-pixels P include the first-color sub-pixel P1 and the second-color sub-pixel P2, and the turn-on voltage of the first-color sub-pixel P1 is greater than the turn-on voltage of the second-color sub-pixel P2, in embodiments of the present disclosure, the width-to-length ratios of the light-emitting elements connected to the first-color sub-pixel P1 and the second-color sub-pixel P2 may be designed to be different. For example, when the width-to-length ratio of the switch element T connected to the first-color sub-pixel P1 is assumed to be the first width-to-length ratio, and the width-to-length ratio of the switch element T connected to the second-color sub-pixel P2 is assumed to be the second width-to-length ratio, the first width-to-length ratio may be configured to be greater than the second width-to-length ratio. The larger the width-to-length ratio of the switch element is, the stronger the driving capability is. When the first width-to-length ratio of the switch element corresponding to the first-color sub-pixel P1 with a higher turn-on voltage is configured to be relatively large, it is beneficial for improving the driving capability of the switch element, that is, the charging capability of the first-color sub-pixel P1 may be improved.

Optionally, it is assumed that the first width-to-length ratio is A1, and the second width-to-length ratio is A2, then $A1=k*A2$, where $1<k\leq2$.

Optionally, the first-color sub-pixel P1 may be a blue sub-pixel, and the second-color sub-pixel P2 may be a red sub-pixel or a green sub-pixel.

Figure 15:
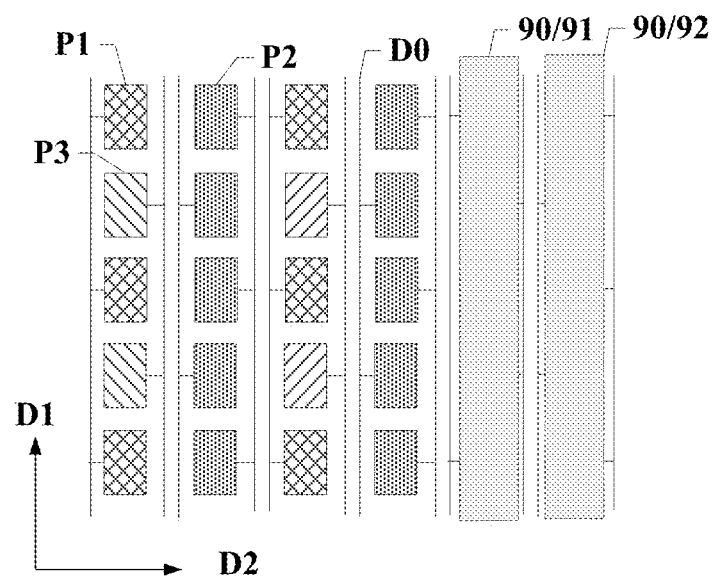
FIG. 15 illustrates a connection schematic of sub-pixels and data lines in a display region of a display panel.

Referring to FIGS. 9, 10 and 15, FIG. 15 illustrates a connection schematic of sub-pixels and data lines D0 in the display region AA of the display panel. In an optional implementation manner of the present disclosure, referring to FIG. 15, the data line D0 may extend along the first direction D1; the display panel may include a plurality of pixel columns 90 arranged along the second direction D2; a same pixel column may include a plurality of sub-pixels arranged along the first direction D1; and the second direction D2 may intersect the first direction D1. In a same pixel column 90, the subpixels in odd rows may share a same data line D0, and the subpixels in even rows may share another data line D0. The sub-pixels may further include third-color sub-pixels P3. The pixel columns may include the first pixel columns 91 and second pixel columns 92 arranged alternately along the second direction D2; the first pixel column 91 may include the first-color sub-pixels P1 and third-color sub-pixels P3 arranged alternately along the first direction D1; and the second pixel column 92 may include the second-color sub-pixels P2 arranged along the first direction D1.

In one embodiment, each column of sub-pixels is correspondingly configured with two data lines D0, and two adjacent sub-pixels in a same column are connected to different data lines D0, such that the data writing of two adjacent rows of sub-pixels may not affect each other. Therefore, at the stage of writing data to the sub-pixel 60 of the x-th row, data writing may continue to be performed on the sub-pixel 60 of the (x−1)-th row, and the writing time of the data signal may be increased, and uneven display problem of high-frequency and high-resolution products may be reduced. In addition, above connection manner may also avoid horizontal stripes on the display and improve the display effect when loadings on two data lines D0 are different.

Referring to FIGS. 9, 10 and 15, in an optional embodiment of the present disclosure, X=2. In a same first pixel column 91, the switch element connected to the first-color sub-pixel P1 is the first sub-switch element T01, the switch element connected to the third-color sub-pixel P3 is the second sub-switch element T02, and the first sub-switch element T01 and the second sub-switch element T02 may be in a same demultiplexing unit 10. In a same second pixel column 92, the switch element connected to the second-color sub-pixel P2 in the odd row is the third sub-switch element T03, the switch element connected to the second-color sub-pixel P2 in the even row is the fourth sub-switch element T04, and the third sub-switch element T03 and the fourth sub-switch element T04 may be in another demultiplexing unit 10. The width-to-length ratios of the switch elements in a same demultiplexing unit 10 may be same.

In one embodiment, the turn-on voltage of the first-color sub-pixel P1 is greater than the turn-on voltage of the second-color sub-pixel P2. Therefore, in order to improve the charging efficiency of the first-color sub-pixel P1, the width-to-length ratio of the first sub-switch element T01 electrically connected to the first-color sub-pixel P1 may be configured to be greater than the width-to-length ratio of the second sub-switch element T02 electrically connected to the second-color sub-pixel P2. Based on above, the first sub-switch element T01 electrically connected to the first-color sub-pixel P1 and the second sub-switch element T02 electrically connected to the third-color sub-pixel P3 are in a same demultiplexing unit 10; and the third sub-switch element T03 and the fourth sub-switch element T04 connected to the second-color sub-pixel P2 are in another demultiplexing unit 10. Therefore, in one embodiment, the width-to-length ratios of the first sub-switch element T01 and the second sub-switch element T02 in a same demultiplexing unit 10 may be configured to be same, and the width-to-length ratios of the third sub-switch element T03 and the fourth sub-switch element T04 in another demultiplexing unit 10 may be configured to be same. Therefore, there is no need to differentiate the width-to-length ratios of the switch elements in a same demultiplexing unit 10, which may improve the charging efficiency of the first-color sub-pixel P1 and also be beneficial for simplifying overall design of the demultiplexing unit 10.

Figure 16:
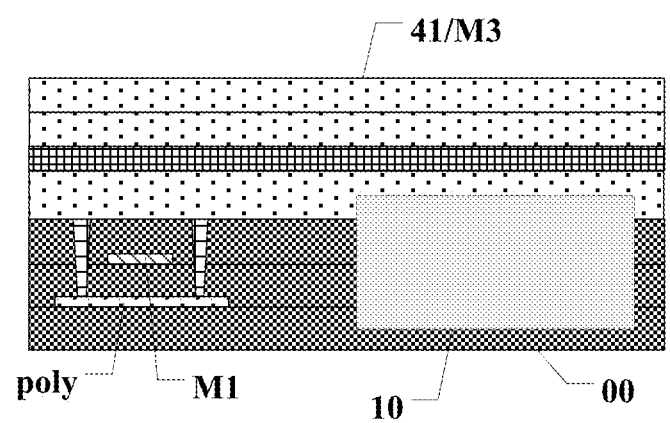
FIG. 16 illustrates a schematic of a film layer in a step region of a display panel according to various embodiments of the present disclosure.

FIG. 16 illustrates a schematic of a film layer in the step region A00 of the display panel according to various embodiments of the present disclosure. Referring to FIGS. 3 and 16, in an optional embodiment of the present disclosure, the step region may further include a blocking layer 41; and along the thickness direction of the display panel in the step region A00, the blocking layer 41 may be overlapped with the demultiplexing unit 10.

Referring to FIG. 3, in the display panel provided by embodiments of the present disclosure, the display panel may include the substrate 00 and a first metal layer M1, a capacitor metal layer MC, a second metal layer M2, a third metal layer M3 and a light-emitting layer 50 which are disposed on the substrate 00. Along the thickness direction of the display panel, the capacitor metal layer MC may be on the side of the first metal layer M1 away from the substrate 00, and the second metal layer M2 may be on the side of the capacitor metal layer MC away from the substrate 00; and the third metal layer M3 may be on the side of the second metal layer M2 away from the substrate 00, and the light-emitting layer 50 may be on the side of the third metal layer M3 away from the substrate 00. Optionally, the light-emitting layer 50 may include an anode 51, a light-emitting material layer 52 and a cathode 53, where the light-emitting material layer 52 may be between the anode 51 and the cathode, and the anode 51 may be between the light-emitting material layer and the third metal layer M3. The display panel may further include a semiconductor layer (that is, poly), and the semiconductor layer poly may be on the side of the first metal layer M1 away from the substrate 00, or on the side of the first metal layer M1 facing the substrate 00, where the first metal layer M1 may be, for example, a gate metal layer, and the gate electrode of the transistor in the display panel may be disposed at the first metal layer M1. The capacitor metal layer MC may be configured to form a capacitor structure with the first metal layer M1 or the second metal layer M2. The source electrode S and the drain electrode D of the transistor in the display panel may be at the second metal layer M2; the semiconductor layer poly may include a source region and a drain region; and the source region and the drain region may be formed by doping N-type impurity ions or P-type impurity ions. The source electrode S of the transistor may be electrically connected to the source region of the semiconductor layer poly through a contact hole, and the drain electrode D of the transistor may be electrically connected to the drain region of the semiconductor layer poly through a contact hole.

Referring to FIG. 16, the switch element in the demultiplexing unit 10 of embodiments of the present disclosure may be embodied as, for example, a transistor. When the blocking layer 41 is disposed in the step region, the blocking layer 41 may be disposed on the side of the demultiplexing unit 10 away from the substrate 00; and along the thickness direction of the display panel in the step region, the blocking layer 41 may be overlapped with the demultiplexing unit 10. In such way, radio frequency interference may be reduced or avoided through the blocking layer 41, and accuracy and stability of the signal transmitted by the demultiplexing unit 10 may be improved.

Optionally, in one embodiment, the solution in which the blocking layer 41 introduced in the step region is at the third metal layer M3 is taken as an example for illustration in FIG. 16. In some other embodiments of the present disclosure, the blocking layer 41 may also be disposed at the film layer where the anode 51 is located. Obviously, referring to FIG. 3, if the display panel further includes a fourth metal layer M4 disposed between the third metal layer M3 and the light-emitting layer 50, the blocking layer 41 may also be disposed at the fourth metal layer M4, which may not be limited in the present disclosure. When the blocking layer 41 is disposed at an existing film layer in the display panel, there is no need to introduce a new film layer structure for the blocking layer 41, which may be beneficial for simplifying overall structure of the display panel.

Figure 17:
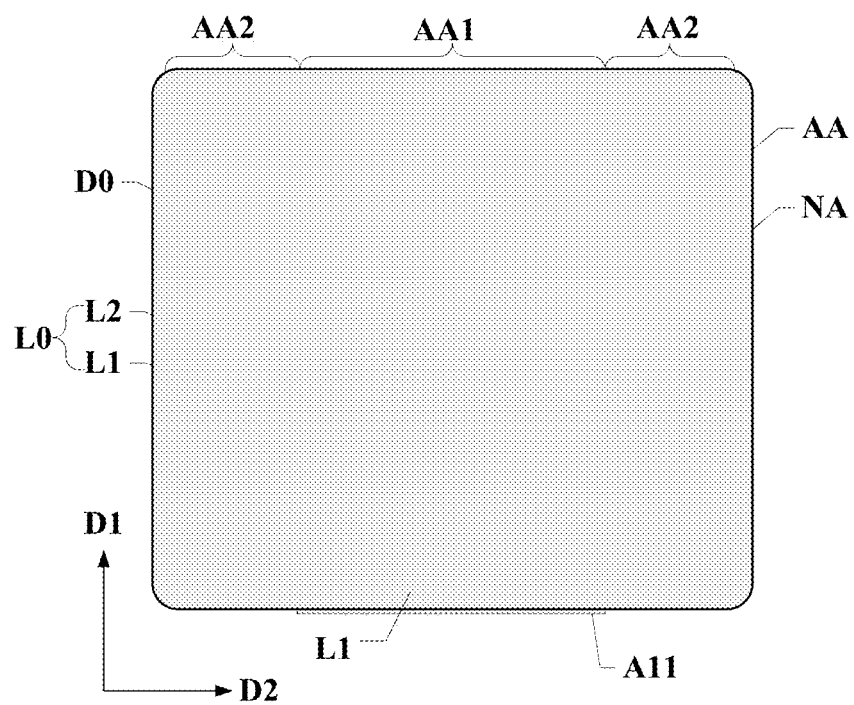
FIG. 17 illustrates another planar schematic of a display panel according to various embodiments of the present disclosure.

FIG. 17 illustrates another planar schematic of a display panel according to various embodiments of the present disclosure. In an optional implementation manner of the present disclosure, referring to FIGS. 1 and 17, the display region AA may include the first display region AA1 and the second display region AA2, where the second display region AA2 is on at least one side of the first display region AA1 along the second direction D2; both the first display region AA1 and the second display region AA2 may include the plurality of data lines D0 which extends along the first direction D1 and is arranged along the second direction D2, where the first direction D1 intersects the second direction D2; and the data line D0 may be electrically connected to the output terminal of the demultiplexing unit through the fan-out wiring L01, where the data line D0 in the second display region AA2 may be electrically connected to the fan-out wiring L01 through the connection line L0 in the display region AA.

It should be noted that, FIG. 17 only exemplarily illustrates the data lines D0 included in the display panel and may not limit the quantity of data lines D0 actually included in the display panel. Similarly, the quantity of data lines D0 included in the first display region AA1 and the second display region AA2 shown in FIG. 17 is only exemplary, which may not indicate actual quantity of data lines D0 included in the first display region AA1 and the second display region AA2. Optionally, in embodiments of the present disclosure, the first display region AA1 may be in the middle region of the display panel, and the second display regions AA2 may be on one or two sides of the display panel along the second direction D2. The second display regions AA2 are disposed on two sides of the first display region AA1 is taken as an example for illustration in FIG. 17. The second display region AA2 may be adjacent to the edge extending along the first direction D1 of the display panel. That is, the data lines D0 in the second display region AA2 may be on two sides of the display region AA along the second direction D2, and the data lines D0 in the first display region AA1 may be in the middle region of the display region AA.

In the display panel provided by embodiments of the present disclosure, the second display region AA2 in the display region AA may be on at least one side of the first display region AA1 along the second direction D2; the first fan-out region A11 may be configured on the side of the display region AA along the first direction D1; the data line D0 in the first display region AA1 may directly extend to the position of the first fan-out region A11 to be electrically connected to the fan-out wiring L01 in the first fan-out region A11; and the data line D0 in the second display region AA2 may be electrically connected to the fan-out wiring in the first fan-out region A11 through the connection line L0 in the display region AA. Optionally, in the display region AA, the connection line L0 may extend from the second display region AA2 to the first display region AA1 and then be electrically connected to the fan-out wiring in the first fan-out region A11 below the first display region AA1. In such way, there is no need to arrange fan-out wirings adjacent to the lower left border and/or lower right border of the display panel, thereby providing a reducible space for the lower left border and lower right border of the display panel, being beneficial for further realizing narrow frame design of the display panel and improving user experience.

Referring to FIG. 17, in an optional implementation manner of the present disclosure, the connection line L0 may include a first connection line segment L1 extending along the first direction D1 and a second connection line segment L2 extending along the second direction D2; the first connection line segment L1 may be electrically connected to the fan-out wiring L01; and the second connection line segment L2 may be electrically connected to the data line D0 in the second display region AA2.

In embodiments of the present disclosure, the data line D0 in the second display region AA2 may be electrically connected to the fan-out wiring in the first fan-out region A11 using the connection line L0. An optional implementation manner is that the connection line L0 may include the first connection line segment L1 and the second connection line segment L2 which are connected to each other. The first connection line segment L1 may extend along the first direction D1, the first end of the first connection line segment L1 may be electrically connected to the fan-out wiring, and the second end of the first connection line segment L1 may be electrically connected to the second connection line segment L2. The second connection line segment L2 may extend along the second direction D2, and an end of the second connection line segment L2, which is not connected to the first connection line segment L1, may be electrically connected to the data line D0 in the second display region AA2. For the signal lines such as data lines D0 and gate lines in the display region AA, the extension direction may be the first direction D1 or the second direction D2. Therefore, when the connection line L0 is introduced in the display region AA, in embodiments of the present disclosure, the first connection line segment L1 and the second connection line segment L2 in the connection line L0 may be respectively configured to extend along the first direction D1 and along the second direction D2, which may realize the narrow frame design of the display panel and also be beneficial for simplify the wiring difficulty of the first connection line segment L1 and the second connection line segment L2.

Referring FIGS. 3 and 17, in an optional implementation manner of the present disclosure, the display panel includes the first metal layer M1, the capacitor metal layer MC, the second metal layer M2, and the third metal layer M3; along the thickness direction of the display panel, the capacitor metal layer MC may be on the side of the first metal layer M1 away from the substrate 00, and the second metal layer M2 may be on the side of the capacitor metal layer MC away from the substrate 00; the third metal layer M3 may be on the side of the second metal layer M2 away from the substrate 00; the data line D0 and the connection line L0 may be disposed in different layers; and one of the first connection line segment L1 and the second connection line segment L2 may be in the capacitor metal layer MC, and the other of the first connection line segment L1 and the second connection line segment L2 may be in the third metal layer M3.

For example, FIGS. 3 and 17, when the connection line L0 is introduced into the display region AA, the data line D0 and the connection line L0 may be disposed in different layers, which may be beneficial for avoiding interference between the data line D0 and the connection line L0. In practical applications, the first connection line segments L1 may be disposed in a same layer, for example, all disposed in the capacitor metal layer MC; and the second connection line segments L2 may be disposed in a same layer, for example, all disposed in the third metal layer M3. In such way, all first connection line segments L1 may be formed by one mask process, and all second connection line segments L2 may be formed by another mask process. Obviously, in some other embodiments of the present disclosure, the first connection line segment L1 may also be disposed in the third metal layer M3, and the second connection line segment L2 may also be disposed in the capacitor metal layer MC, which may not be limited in the present disclosure.

In some other embodiments of the present disclosure, referring to FIGS. 3 and 17, the display panel may further include the fourth metal layer M4, where the fourth metal layer M4 may be on the side of the third metal layer M3 away from the substrate 00. At this point, optionally, both the first connection line segment L1 and the second connection line segment L2 may be in the fourth metal layer M4.

In some other embodiments of the present disclosure, referring to FIGS. 3 and 17, the first connection line segment L1 and the data line D0 may also be disposed in a same layer. In such way, the first connection line segment L1 and the data line D0 may be formed by one mask process. The second connection line segment L2 and the data line D0 may be disposed in different layers. For example, the second connection line segment L2 may be disposed in any film layer of the first metal layer M1, the capacitor metal layer MC, the third metal layer M3 or the fourth metal layer M4, which may avoid a short circuit between the second connection line segment L2 and the data line D0.

Figure 18:
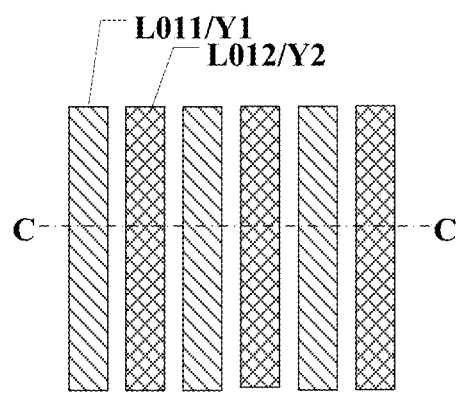
FIG. 18 illustrates a local enlarged schematic of fan-out wirings corresponding to a region Q in FIG. 1.
Figure 19:
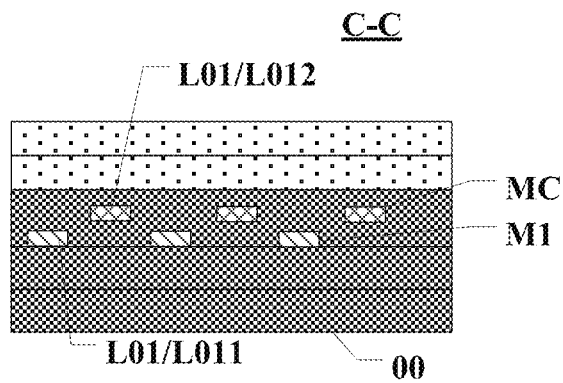
FIG. 19 illustrates a schematic of a film layer of fan-out wirings along a CC direction in FIG. 18.

Referring to FIGS. 1, 18 and 19, FIG. 18 illustrates a local enlarged schematic of a fan-out wiring corresponding to a region Q in FIG. 1; and FIG. 19 illustrates a schematic of a film layer of the fan-out wiring along a CC direction in FIG. 18. In an optional implementation manner of the present disclosure, in the first fan-out region A11, at least one fan-out wiring L01 may be on the first metal layer M1, and at least one fan-out wiring L01 may be on the capacitor metal layer MC.

For example, when the fan-out wirings L01 in the first fan-out region A11 are distributed in two different film layers, in the orthographic projections to the substrate 00, the center-to-center distance between the orthographic projections of two adjacent fan-out wirings may be configured to be relatively small. Therefore, it is beneficial for reducing the width of the first fan-out region A11 along the second direction D2, reducing the space occupied by the first fan-out region A11 in the first region A1 and saving wiring space, thereby being further reducing the frame width of the display panel.

Referring to FIGS. 18-19, in an optional implementation manner of the present disclosure, the fan-out wiring in the first metal layer M1 may be the first sub-fan-out wiring L011; the fan-out wiring in the capacitor metal layer MC may be the second sub-fan-out wiring L012; the orthographic projection of the first sub-fan-out wiring L011 on the substrate 00 is the first projection Y1; the orthographic projection of the second sub-fan-out wiring L012 on the substrate 00 is the second projection Y2; and the first projection Y1 and the second projection Y2 may be arranged alternately.

In one embodiment, the fan-out wirings in the first fan-out region A11 may be alternately configured in the first metal layer M1 and the capacitor metal layer MC. In such way, the quantities of fan-out wirings in the first metal layer M1 and the capacitor metal layer MC may be same or approximately same; and the spaces of the first metal layer M1 and the capacitor metal layer MC in the first fan-out region A11 may be reasonably utilized. In addition, the manner of alternately arranging the first projection Y1 of the first sub-fan-out wiring L011 and the second projection Y2 of the second sub-fan-out wiring L012 may also be beneficial for increasing the distance between adjacent first sub-fan-out wirings L011 in the first metal layer M1, increasing the distance between adjacent second sub-fan-out wirings L012 in the capacitor metal layer MC, and avoiding crosstalk problem caused by excessively small distance between two adjacent fan-out wirings in a same metal layer.

Figure 20:
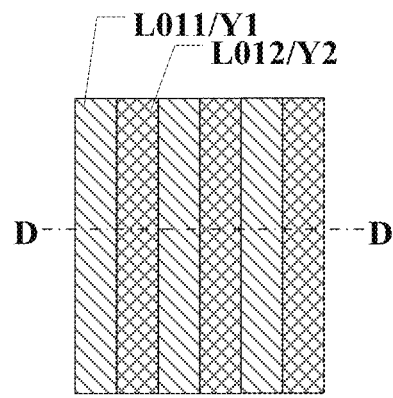
FIG. 20 illustrates another local enlarged schematic of fan-out wirings corresponding to a region Q in FIG. 1.
Figure 21:
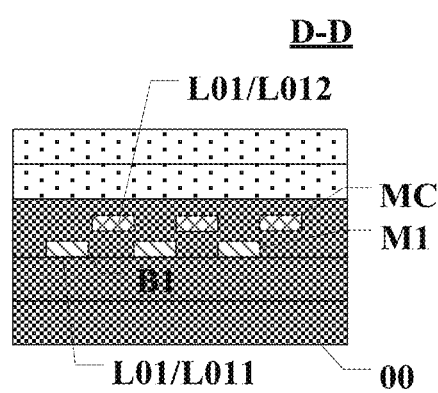
FIG. 21 illustrates a schematic of a film layer of fan-out wirings along a DD direction in FIG. 18.

FIG. 20 illustrates another local enlarged schematic of a fan-out wiring corresponding to the region Q in FIG. 1. FIG. 21 illustrates a schematic of a film layer of a fan-out wiring along a DD direction in FIG. 18. Referring to FIGS. 20-21, in an optional implementation manner of the present disclosure, in the first projection Y1 and second projection Y2 which are adjacent to each other, the edge of the first projection Y1 adjacent to the second projection Y2 is the first edge B1, the edge of the second projection Y2 adjacent to the first projection Y1 is the second edge B2, and the first edge B1 may coincide with the second edge B2.

It should be noted that the coincidence of the first edge B1 and the second edge B2 mentioned in embodiments of the present disclosure may indicate that within the allowable error range, the distance between the first projection Y1 and the second projection Y2 which are adjacent to each other may be 0. In one embodiment, along the direction perpendicular to the substrate 00, the first sub-fan-out wiring L011 and the second sub-fan-out wiring L012 may not be overlapped with each other, which may be beneficial for avoiding the interference of the coupling capacitance, which is formed when the first sub-fan-out wiring L011 is overlapped with the second sub-fan-out wiring L012, on the signals transmitted on the first sub-fan-out wiring L011 and the second sub-fan-out wiring L012, thereby being beneficial for improving accuracy and stability of the signals transmitted on the first sub-fan-out wiring L011 and the second fan-out wiring. In addition, the first edge B1 and the second edge B2 which correspond to the first sub-fan-out wiring L011 and the second sub-fan-out wiring may be configured to be coincided with each other, which may be also beneficial for saving the wiring space of the fan-out wirings in the first fan-out region A11.

Figure 22:
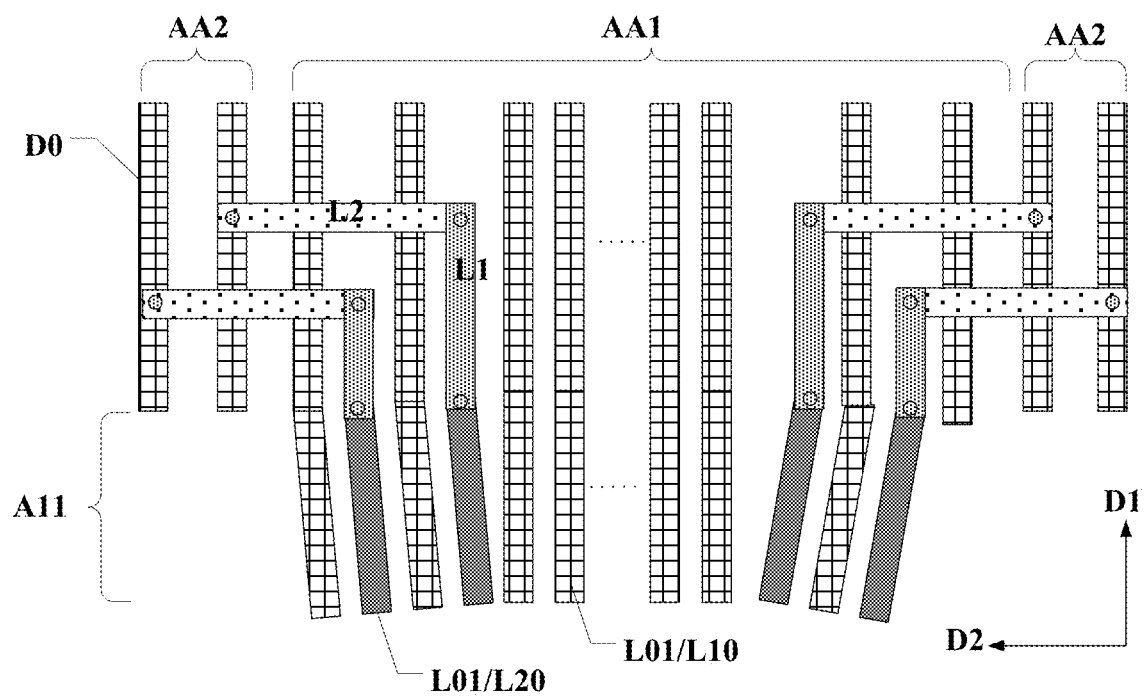
FIG. 22 illustrates a layout schematic of fan-out wirings connected to data lines in a first display region and a second display region.

FIG. 22 illustrates a layout schematic of fan-out wirings connected to data lines D0 in the first display region AA1 and the second display region AA2. Referring to FIG. 22, in an optional implementation manner of the present disclosure, in the first fan-out region A11, the fan-out wiring L01 connected to the data line D0 in the first display region AA1 is the first fan-out wiring L10, and the orthographic projection of the first fan-out wiring L10 on the substrate 00 is the third projection; the fan-out wiring connected to the data line D0 in the second display region AA2 is the second fan-out wiring L20, and the orthographic projection of the second fan-out wiring L20 on the substrate 00 is the fourth projection; and at least one fourth projection may be between two adjacent third projections.

For example, in embodiments of the present disclosure, the data line D0 in the first display region AA1 may be directly connected to the first fan-out wiring L10 in the first fan-out region A11; the data line D0 in the second display region AA2 may be electrically connected to the second fan-out wiring L20 in the first fan-out region A11 through the connection line L0; and the fourth projection of the second fan-out wiring L20 on the substrate 00 may be between the third projections of two adjacent third fan-out wirings on the substrate 00. In such way, the connection line L0 may be connected to an adjacent second fan-out wiring L20, which may simplify the arrangement form of the fan-out wirings in the first fan-out region A11.

It should be noted that in drawings provided by the present disclosure, such as cross-sectional views and planar schematics, structures with same filled lines may be in a same film layer, and structures with different filled lines may be in different film layers. Optionally, structures with same filled lines may be made in a same process.

Figure 23:
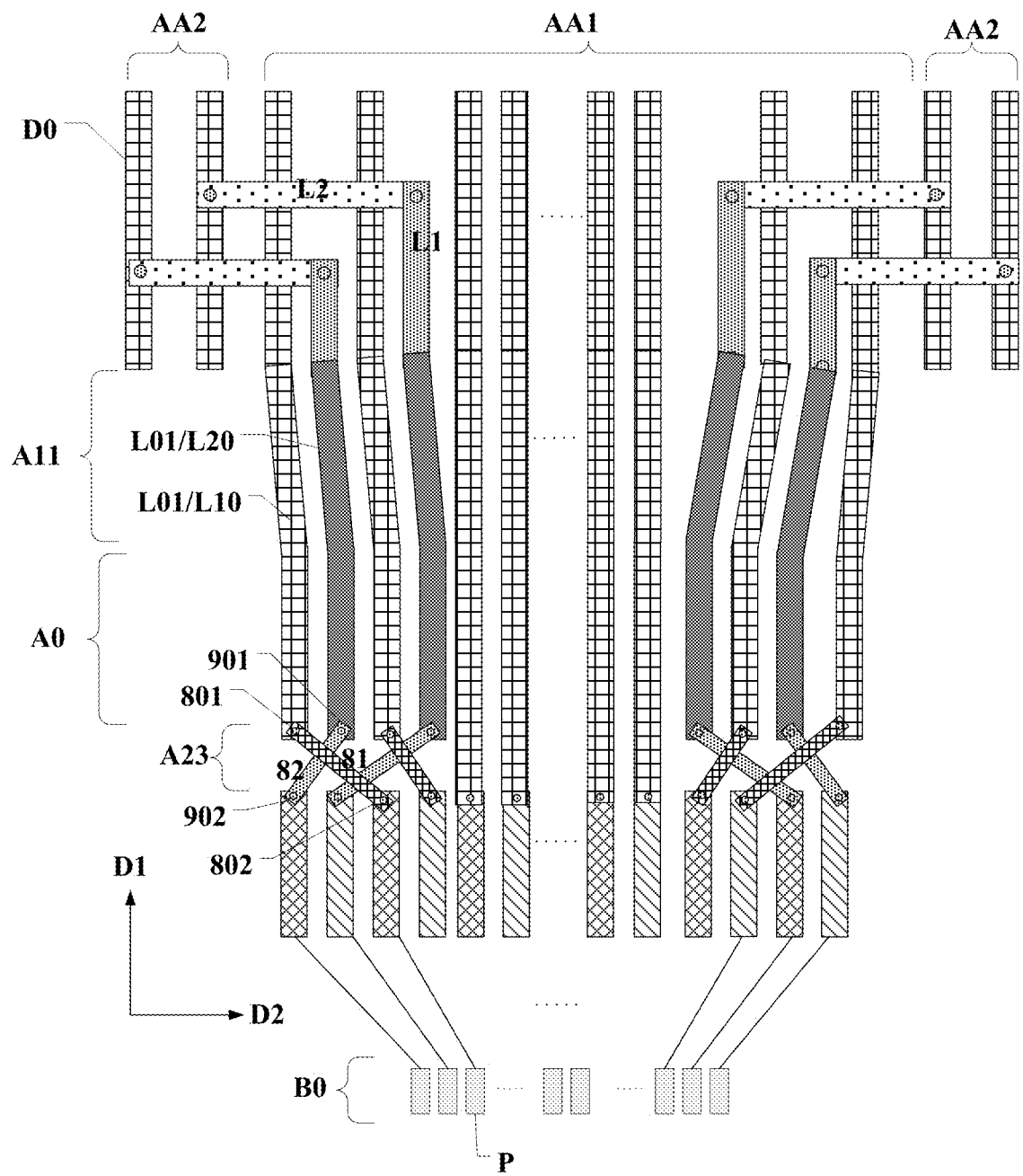
FIG. 23 illustrates an arrangement schematic of data lines, fan-out wirings, and first and second leads in a line-changing region.

FIG. 23 illustrates an arrangement schematic of data lines D0, fan-out wirings, and first leads 81 and second leads 82 in a line-changing region. Referring to FIGS. 9 and 23, in an optional embodiment of the present disclosure, the step region A00 may further include a line changing region A23 between the bending region A0 and the binding region B0; the line changing region A23 may include the first lead 81 and the second lead 82, the first end 801 of the first lead 81 may be connected to the first fan-out wiring L10, the first end 901 of the second lead 82 may be connected to the second fan-out wiring L20, and the second end 802 of the first lead 81 and the second end 902 of the second lead 82 may be electrically connected to different conductive soldering pads P respectively; and along the second direction D2, the arrangement order of the second end 802 of the first lead 81 and the second end 902 of the second lead 82 may be same as the arrangement order of the data line groups Z in the display region.

For example, referring to FIGS. 9 and 23, when the connection line L0 is introduced into the display panel to electrically connect the data line D0 in the second display region AA2 with the second fan-out wiring L20 in the first fan-out wiring L10, since the second fan-out wiring L20 is disposed between two adjacent first fan-out wirings L10, the n-th data line D0 arranged along the second direction D2 may not be electrically connected to the n-th fan-out wiring arranged along the second direction D2, which may be equivalent to that the arrangement order of the fan-out wirings in the first fan-out region A11 may be different from the arrangement order of the data lines D0 in the display region AA. In embodiments of the present disclosure, the line changing region A23 may be introduced between the bending region A0 and the binding region B0; the first end of the first lead 81 in the line changing region A23 may be electrically connected to the first fan-out wiring L10, and the first end of the second lead 82 may be electrically connected to the second fan-out wiring L20; and the arrangement order of the second ends of the first leads 81 and the second ends of the second leads 82 may be same as the arrangement order of the data line groups Z. That is, the n-th data line D0 arranged along the second direction D2 may be electrically connected to the lead corresponding to the n-th second end arranged along the second direction D2 in the line changing region A23 through the fan-out wiring. For example, the 1st data line D0 along the second direction D2 may be connected to the 2nd lead 82 through the second fan-out wiring L20. In the line changing region A23, the second end 902 of the second lead wiring 82 is arranged at the first position, and such second end 902 may be electrically connected to the 1st conductive soldering pad P among the conductive soldering pads connected to the data lines in the binding region B0. For another example, the $2^{nd}$ data line D0 along the second direction D2 may be connected to another second lead 82 through the second fan-out wiring L20; and in the line changing region A23, the second end of the second lead wiring 82 may be arranged in the second position, and such second terminal 902 may be electrically connected to the second conductive soldering pad P among the conductive soldering pads connected to the data lines in the binding region B0. In such way, there is no need to change original arrangement order of the conductive soldering pads P in the binding region B0, which may simplify the structure of the control chip bound to the binding region.

In an optional implementation manner of the present disclosure, the second lead 82 may be disposed in a different layer from the second fan-out wiring L20 and the first fan-out wiring L10. When the wirings in the line changing region A23 and the fan-out wirings in the first fan-out region A11 are disposed in different layers, it is equivalent to disposing the leads in the line changing region A23 at another film layer than the fan-out wirings in the first fan-out region. In such way, the wirings in the line changing region A23 may be electrically connected to the fan-out wirings in the first fan-out region A11 through connection holes. Optionally, the first leads 81 and the second leads 81 in the line changing region A23 may be disposed in different film layers, such that the arrangement order of the second ends of the first leads 81 and the second leads 82 may be same as the arrangement order of the data lines.

Figure 24:
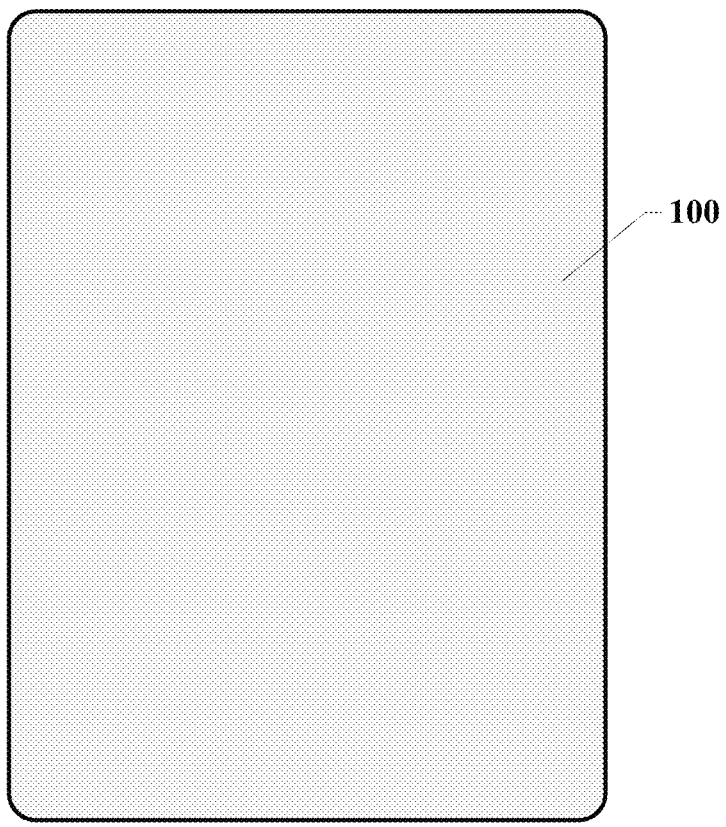
FIG. 24 illustrates a structural schematic of a display apparatus according to various embodiments of the present disclosure.

Based on the same inventive concept, the present disclosure also provides a display apparatus. FIG. 24 illustrates a structural schematic of a display apparatus according to various embodiments of the present disclosure. Referring to FIG. 24, the display apparatus 200 may include the display panel 100 provided by any one of above-mentioned embodiments of the present disclosure.

It may be understood that the display apparatus provided in embodiments of the present disclosure may be a computer, a mobile phone, a tablet, or other display apparatuses with a display function, which may not be limited in the present disclosure. The display apparatus provided by embodiments of the present disclosure may have the beneficial effect of the display panel provided by embodiments of the present disclosure. Details may refer to the description of the display panel in above-mentioned embodiments, which may not be described in detail in one embodiment.

From above-mentioned embodiments, it may be seen that the display panel and the display apparatus provided by the present disclosure may achieve at least following beneficial effects.

In the display panel provided by embodiments of the present disclosure, the non-display region may include the step region configured on one side of the display region, where the step region may include the first region, the bending region and the second region; the first region may be adjacent to the display region; the bending region may be between the first region and the second region; the binding region may be configured in the second region; and the binding region may include the plurality of conductive soldering pads. With the bending of the bending region, the second region in the step region may be folded back to the non-light-emitting surface of the display panel. The display region may include the plurality of data lines; the data lines may be electrically connected to the conductive soldering pads of the binding region through the demultiplexing units; and the signals on the conductive soldering pads may then be transmitted to the data lines through the demultiplexing units. Particularly, in the present disclosure, the demultiplexing units may be disposed at the second region in the step region, for example, between the binding region and the bending region. In such way, when the step region is bent at the position of the bending region, the demultiplexing units may be bent back to the non-light-emitting surface of the display panel with the bending of the step region, which may avoid occupying the space of the first region and provide a reducible space for the frame width corresponding to the first region, thereby being beneficial for realizing the narrow frame design of the display panel, increasing the screen-to-body ratio of the display product, and further improving user experience effect.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A display panel, comprising:
   a display region and a non-display region surrounding the display region, wherein the non-display region includes a step region on a side of the display region; the step region includes a bending region, a first region between the bending region and the display region, and a second region on a side of the bending region away from the display region; and the second region includes a binding region;
   an array substrate, including a flexible substrate and an array layer on the flexible substrate;
   a plurality of data lines at the array layer and in the display region;
   a plurality of conductive soldering pads in the binding region; and
   a plurality of demultiplexing units in the second region and between the binding region and the bending region, wherein output terminals of the plurality of demultiplexing units are electrically connected to the plurality of data lines respectively, and input terminals of the plurality of demultiplexing units are electrically connected to the plurality of conductive soldering pads,
   wherein the step region further includes a first fan-out region; the first fan-out region is in the first region and includes a plurality of fan-out wirings; and output terminals of the plurality of demultiplexing units are electrically connected to the plurality of data lines through the plurality of fan-out wirings.

2. The display panel according to claim 1, wherein:
   the step region further includes a detection circuit region between the bending region and the binding region; and
   the detection circuit region includes a plurality of detection circuit units which is electrically connected to the plurality of data lines through the plurality of demultiplexing units.

3. The display panel according to claim 2, wherein:
the plurality of demultiplexing units is between the detection circuit region and the binding region or between the detection circuit region and the bending region.

4. The display panel according to claim 2, wherein:
the plurality of demultiplexing units is between the detection circuit region and the bending region; the second region further includes a second fan-out region between the plurality of demultiplexing units and the plurality of detection circuit units; and the plurality of detection circuit units is electrically connected to the plurality of demultiplexing units through a plurality of fan-out wirings of the second fan-out region.

5. A display panel comprising:
a display region and a non-display region surrounding the display region, wherein the non-display region includes a step region on a side of the display region; the step region includes a bending region, a first region between the bending region and the display region, and a second region on a side of the bending region away from the display region; and the second region includes a binding region;
an array substrate, including a flexible substrate and an array layer on the flexible substrate;
a plurality of data lines at the array layer and in the display region;
a plurality of conductive soldering pads in the binding region; and
a plurality of demultiplexing units in the second region and between the binding region and the bending region, wherein output terminals of the plurality of demultiplexing units are electrically connected to the plurality of data lines respectively, and input terminals of the plurality of demultiplexing units are electrically connected to the plurality of conductive soldering pads, wherein:
the display panel includes a plurality of data line groups, and a data line group includes X data lines, wherein X≥2 and X is an integer; a demultiplexing unit includes X switch elements T; a switch element T includes a control terminal, an input terminal and an output terminal; input terminals of the X switch elements of a same demultiplexing unit are connected to each other and electrically connected to a same conductive soldering pad; and output terminals of the X switch elements of the same demultiplexing unit are connected to the X data lines of a same data line group in a one-to-one correspondence;
the display panel further includes X switch control lines, and control terminals of the X switch elements of the demultiplexing unit are connected to the X switch control lines in a one-to-one correspondence; and
the same demultiplexing unit includes a first switch element and a second switch element; switch control lines include a first switch control line and a second switch control line; a control terminal of the first switch element is electrically connected to the first switch control line; and a control terminal of the second switch element is electrically connected to the second switch control line.

6. The display panel according to claim 5, wherein:
in two adjacent demultiplexing units, two first switch elements are adjacent to each other and control terminals of the two adjacent first switch elements are connected to the first switch control line through a same wiring; or two second switch elements are adjacent to each other and control terminals of the two adjacent second switch elements are connected to the second switch control line through a same wiring.

7. The display panel according to claim 5, wherein:
the display region includes a plurality of sub-pixels which is electrically connected to a plurality of switch elements through the plurality of data lines; the plurality of sub-pixels includes a first-color sub-pixel and a second-color sub-pixel; a turn-on voltage of the first-color sub-pixel is greater than a turn-on voltage of the second-color sub-pixel; a width-to-length ratio of a switch element connected to the first-color sub-pixel is a first width-to-length ratio; a width-to-length ratio of a switch element connected to the second-color sub-pixel is a second width-to-length ratio; and the first width-to-length ratio is greater than the second width-to-length ratio.

8. The display panel according to claim 7, wherein:
the plurality of data lines extends along a first direction; the display panel includes a plurality of pixel columns arranged along a second direction; a same pixel column includes a plurality of sub-pixels arranged along the first direction; the second direction intersects the first direction; and in a same pixel column, subpixels in odd rows share a same data line, and subpixels in even rows share another data line; and
the plurality of sub-pixels further includes a third-color sub-pixel; the plurality of pixel columns includes first pixel columns and second pixel columns arranged alternately along the second direction; a first pixel column includes first-color sub-pixels and third-color sub-pixels alternately arranged along the first direction; and a second pixel column includes second-color sub-pixels arranged along the first direction.

9. The display panel according to claim 8, wherein:
when X=2, in a same first pixel column, a switch element connected to a first-color sub-pixel is a first sub-switch element; a switch element connected to a third-color sub-pixel is a second sub-switch element; and the first sub-switch element and the second sub-switch element are in a same demultiplexing unit;
in a same second pixel column, a switch element connected to a second-color sub-pixel in an odd row is a third sub-switch element; a switch element connected to a second-color sub-pixel in an even row is a fourth sub-switch element; and the third sub-switch element and the fourth sub-switch element are in another demultiplexing unit; and
width-to-length ratios of switch elements in the same demultiplexing unit are same.

10. A display panel comprising:
a display region and a non-display region surrounding the display region, wherein the non-display region includes a step region on a side of the display region; the step region includes a bending region, a first region between the bending region and the display region, and a second region on a side of the bending region away from the display region; and the second region includes a binding region;
an array substrate, including a flexible substrate and an array layer on the flexible substrate;
a plurality of data lines at the array layer and in the display region;
a plurality of conductive soldering pads in the binding region; and
a plurality of demultiplexing units in the second region and between the binding region and the bending region, wherein output terminals of the plurality of demultiplexing units are electrically connected to the plurality of data lines respectively, and input terminals of the plurality of demultiplexing units are electrically connected to the plurality of conductive soldering pads, wherein the step region further includes a blocking layer; and along a thickness direction of the display panel in the step region, the blocking layer is overlapped with the plurality of demultiplexing units.

11. The display panel according to claim 1, wherein:
the display region includes a first display region and a second display region; the second display region is on at least one side of the first display region along a second direction; both the first display region and the second display region include a plurality of data lines which extends along a first direction and is arranged along the second direction; the first direction intersects the second direction; and a data line is electrically connected to an output terminal of a demultiplexing unit through a fan-out wiring, wherein a data line in the second display region is electrically connected to a fan-out wiring through a connection line in the display region.

12. The display panel according to claim 11, wherein:
the connection line includes a first connection line segment extending along the first direction and a second connection line segment extending along the second direction; the first connection line segment is electrically connected to the fan-out wiring; and the second connection line segment is electrically connected to the data line in the second display region.

13. The display panel according to claim 12, wherein:
the display panel includes a first metal layer, a capacitor metal layer, a second metal layer and a third metal layer; and along a thickness direction of the display panel, the capacitor metal layer is on a side of the first metal layer away from the substrate; the second metal layer is on a side of the capacitor metal layer away from the substrate; the third metal layer is on the side of the second metal layer away from the substrate; and the data line and the connection line are disposed in different layers; one of the first connection line segment and the second connection line segment is in the capacitor metal layer, and the other one of the first connection line segment and the second connection line segment is in the third metal layer.

14. The display panel according to claim 13, wherein:
in the first fan-out region, at least one fan-out wiring is in the first metal layer, and at least one fan-out wiring is in the capacitor metal layer.

15. The display panel according to claim 14, wherein:
a fan-out wiring in the first metal layer is a first sub-fan-out wiring; a fan-out wiring in the capacitor metal layer is a second sub-fan-out wiring; an orthographic projection of the first sub-fan-out wiring on the substrate is a first projection; an orthographic projection of the second sub-fan-out wiring on the substrate is a second projection; and the first projection and the second projection are arranged alternately.

16. The display panel according to claim 15, wherein:
in the first projection and the second projection which are adjacent to each other, an edge of the first projection adjacent to the second projection is a first edge, an edge of the second projection adjacent to the first projection is the second edge, and the first edge is coincided with the second edge.

17. The display panel according to claim 11, wherein:
in the first fan-out region, a fan-out wiring connected to a data line in the first display region is a first fan-out wiring, and an orthographic projection of the first fan-out wiring on the substrate is a third projection; the fan-out wiring connected to the data line in the second display region is a second fan-out wiring, and an orthographic projection of the second fan-out wiring on the substrate is a fourth projection; and at least one fourth projection is between two adjacent third projections.

18. The display panel according to claim 17, wherein:
the step region further includes a line changing region between the bending region and the binding region; the line changing region includes a first lead and a second lead; a first end of the first lead is connected to the first fan-out wiring; a first end of the second lead is connected to the second fan-out wiring; second ends of the first lead and the second lead are electrically connected to different conductive soldering pads respectively; and along the second direction, an arrangement order of the second ends of the first lead and the second lead is same as an arrangement order of data line groups in the display region.

* * * * *